United States Patent
Luo et al.

(10) Patent No.: US 12,107,174 B2
(45) Date of Patent: Oct. 1, 2024

(54) LIGHT DETECTING DEVICE AND SYSTEM

(71) Applicant: SONY SEMICONDUCTOR SOLUTIONS CORPORATION, Kanagawa (JP)

(72) Inventors: Dan Luo, Kanagawa (JP); Tatsuki Nishino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 280 days.

(21) Appl. No.: 17/760,875

(22) PCT Filed: Jun. 16, 2020

(86) PCT No.: PCT/JP2020/023498
§ 371 (c)(1),
(2) Date: Mar. 16, 2022

(87) PCT Pub. No.: WO2021/059619
PCT Pub. Date: Apr. 1, 2021

(65) Prior Publication Data
US 2022/0344521 A1    Oct. 27, 2022

(30) Foreign Application Priority Data
Sep. 27, 2019 (JP) .................. 2019-176633

(51) Int. Cl.
*H01L 31/02* (2006.01)
*G01J 1/44* (2006.01)
(Continued)

(52) U.S. Cl.
CPC .......... *H01L 31/02027* (2013.01); *G01J 1/44* (2013.01); *G01S 7/4865* (2013.01); *H01L 31/107* (2013.01); *G01J 2001/4466* (2013.01)

(58) Field of Classification Search
CPC ............. H01L 31/02027; H01L 31/107; H01L 27/146; G01J 1/44; G01J 2001/4466;
(Continued)

(56) References Cited

U.S. PATENT DOCUMENTS 5,548,112 A * 8/1996 Nakase ................. H01L 31/107
250/214 R
2010/0301194 A1   12/2010 Patel et al.
2018/0180471 A1   6/2018 Marra et al.

FOREIGN PATENT DOCUMENTS

EP       3339888        6/2018
JP       H10115550 A    5/1998
(Continued)

OTHER PUBLICATIONS

International Search Report prepared by the European Patent Office on Sep. 1, 2020, for International Application No. PCT/JP2020/023498, 3 pgs.

(Continued)

*Primary Examiner* — Thanh Luu
*Assistant Examiner* — Monica T Taba
(74) *Attorney, Agent, or Firm* — SHERIDAN ROSS P.C.

(57) ABSTRACT

A light detecting device includes first pixel circuitry including a first avalanche photodiode, and second pixel circuitry including a second avalanche photodiode, a first delay circuit including an input coupled to a cathode of the second avalanche photodiode, a first circuit including a first input coupled to the cathode of the second avalanche photodiode, and a second input coupled to an output of the first delay circuit. The light detecting device includes a control circuit coupled to an output of the first circuit and configured to control a potential of an anode of the first avalanche photodiode based on the output of the first circuit. The control circuit is configured to control a potential of an anode of the (Continued)

second avalanche photodiode based on the output of the first circuit.

20 Claims, 35 Drawing Sheets

(51) Int. Cl.
*G01S 7/4865* (2020.01)
*H01L 31/107* (2006.01)

(58) Field of Classification Search
CPC ........ G01J 1/46; G01S 7/4865; G01S 7/4861; G01S 7/4863; G01S 7/497
See application file for complete search history.

(56) References Cited

FOREIGN PATENT DOCUMENTS

| | | |
|---|---|---|
| JP | 2019-075394 | 5/2019 |
| TW | I543350 B | 7/2016 |
| WO | WO-2019087783 A1 | 5/2019 |

OTHER PUBLICATIONS

Written Opinion prepared by the European Patent Office on Sep. 1, 2020, for International Application No. PCT/JP2020/023498, 7 pgs.

\* cited by examiner

[Fig. 1]
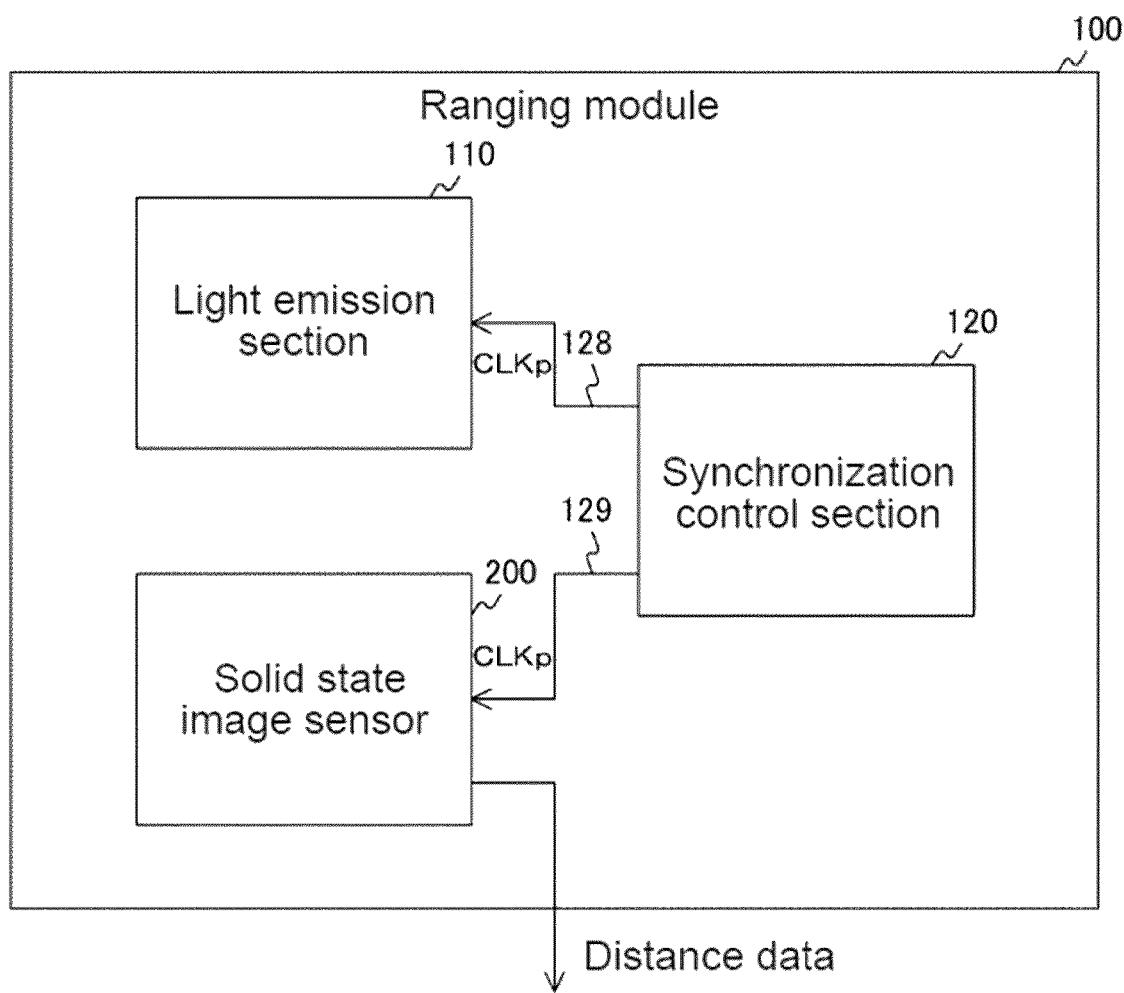

[Fig. 2]
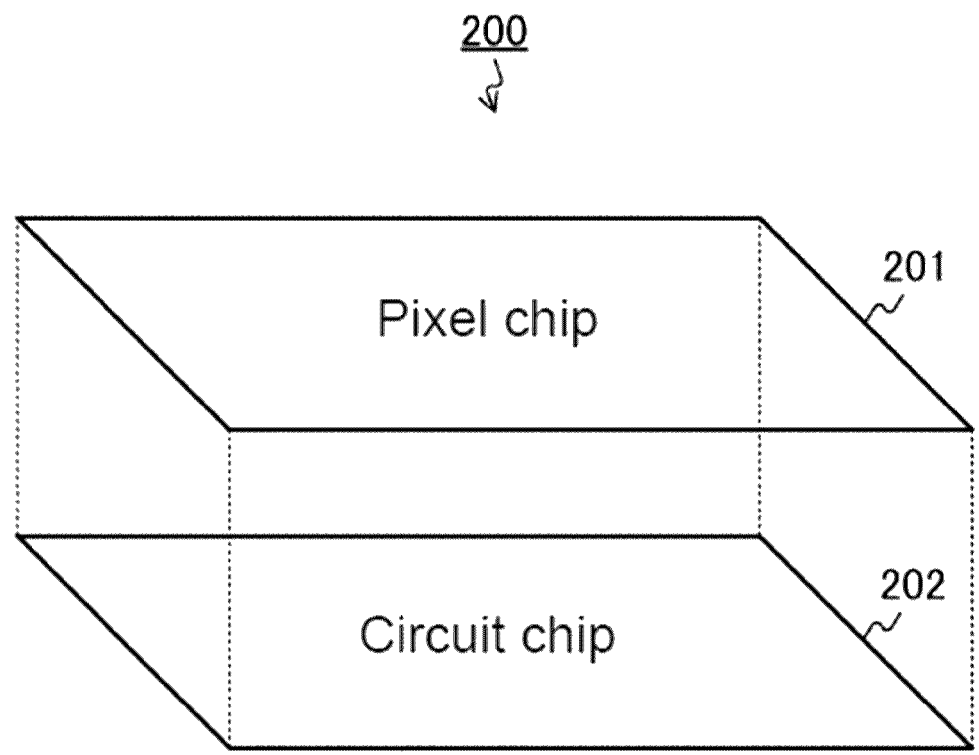

[Fig. 3]
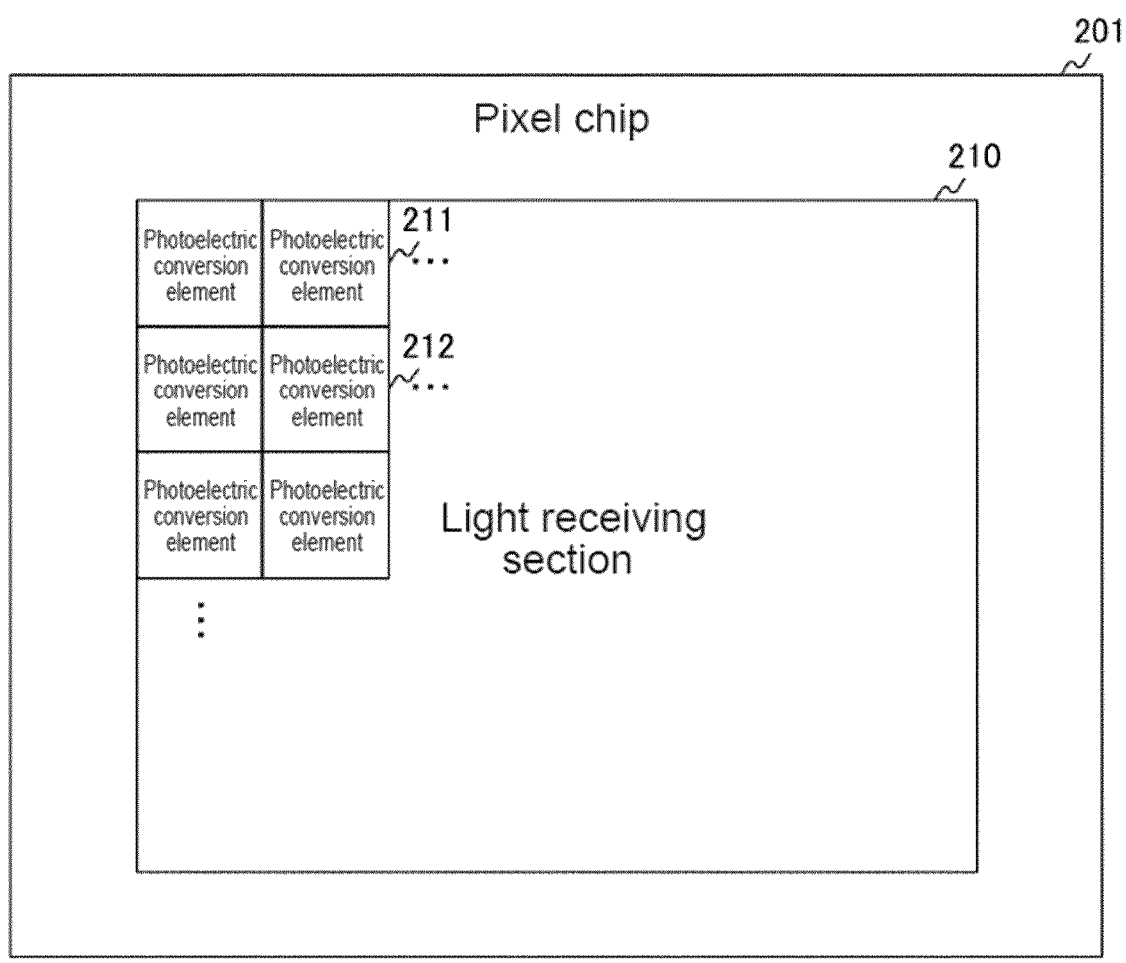

[Fig. 4]
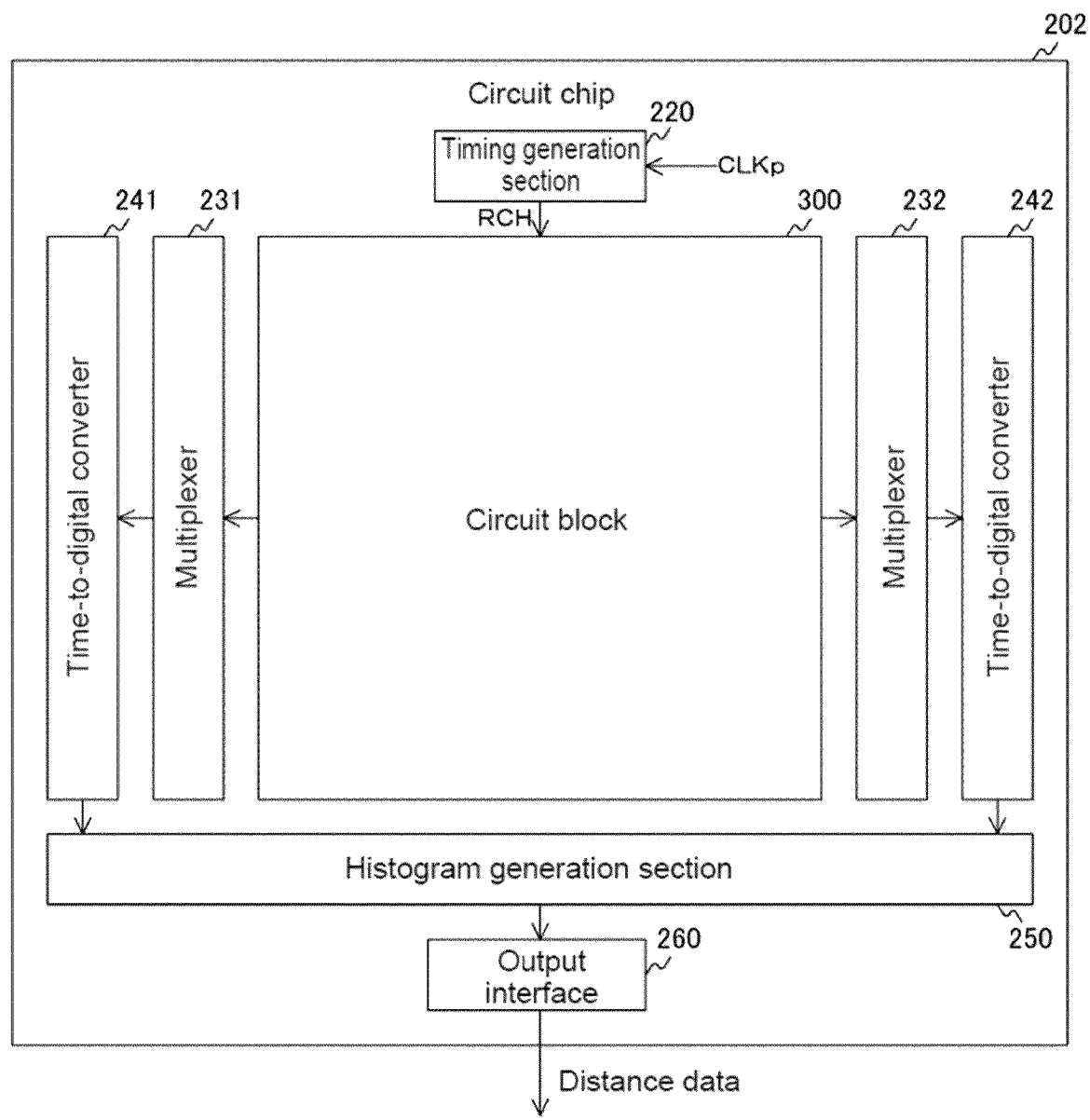

[Fig. 5]
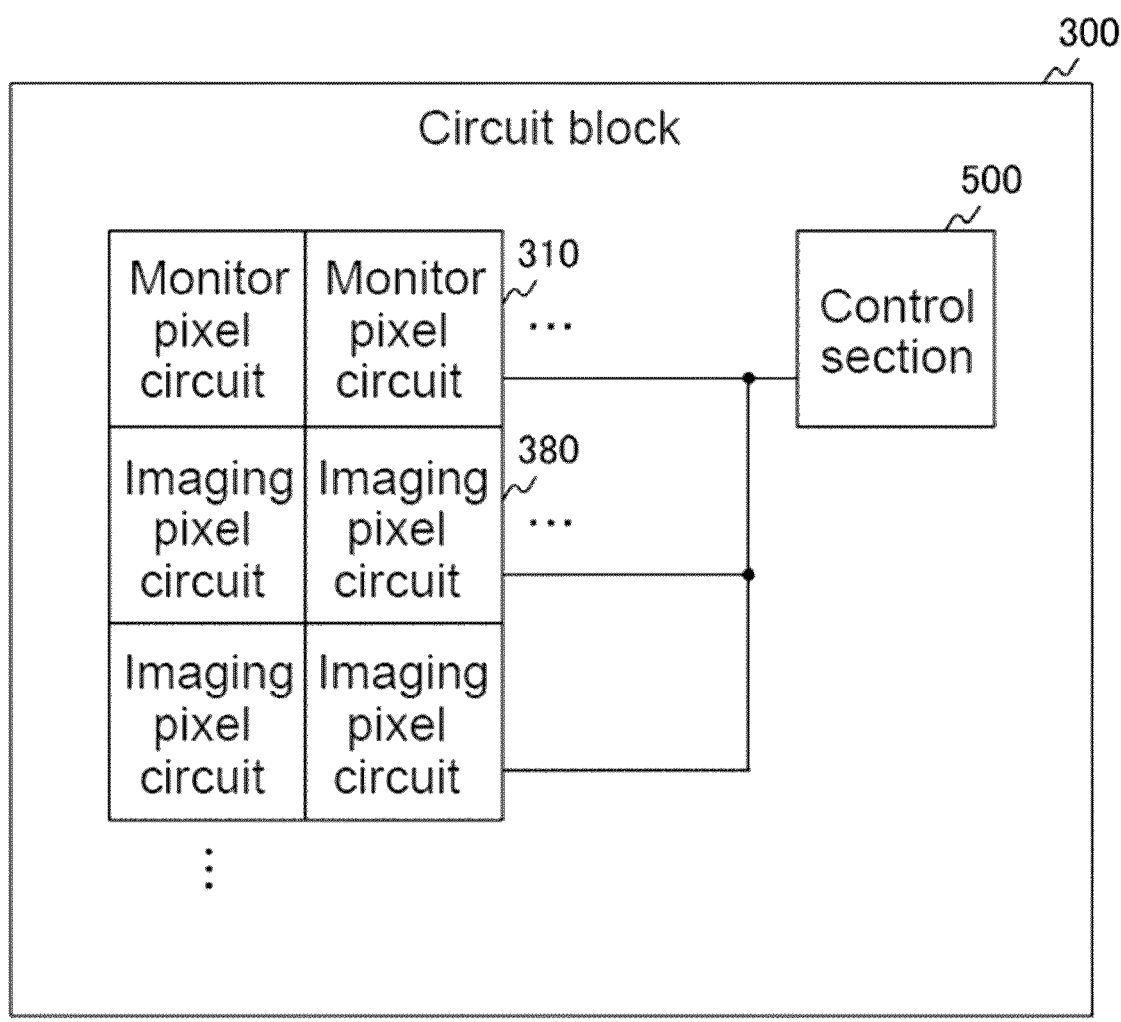

[Fig. 6]
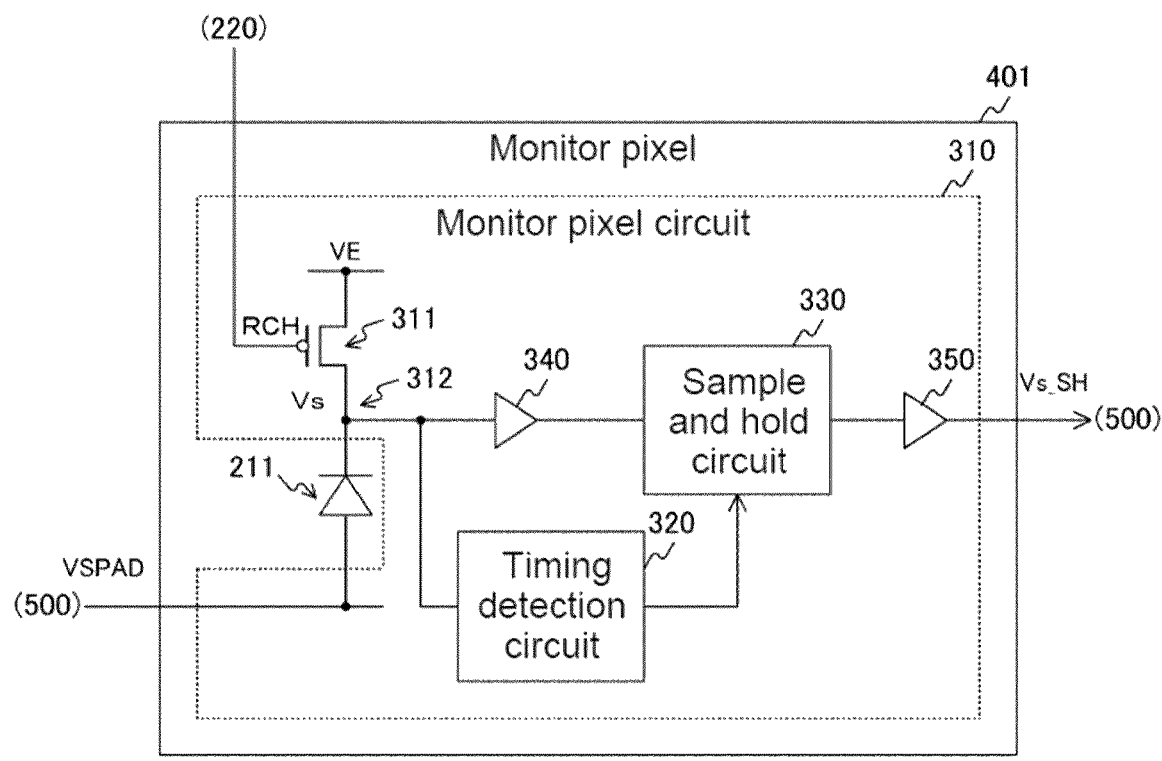

[Fig. 7]
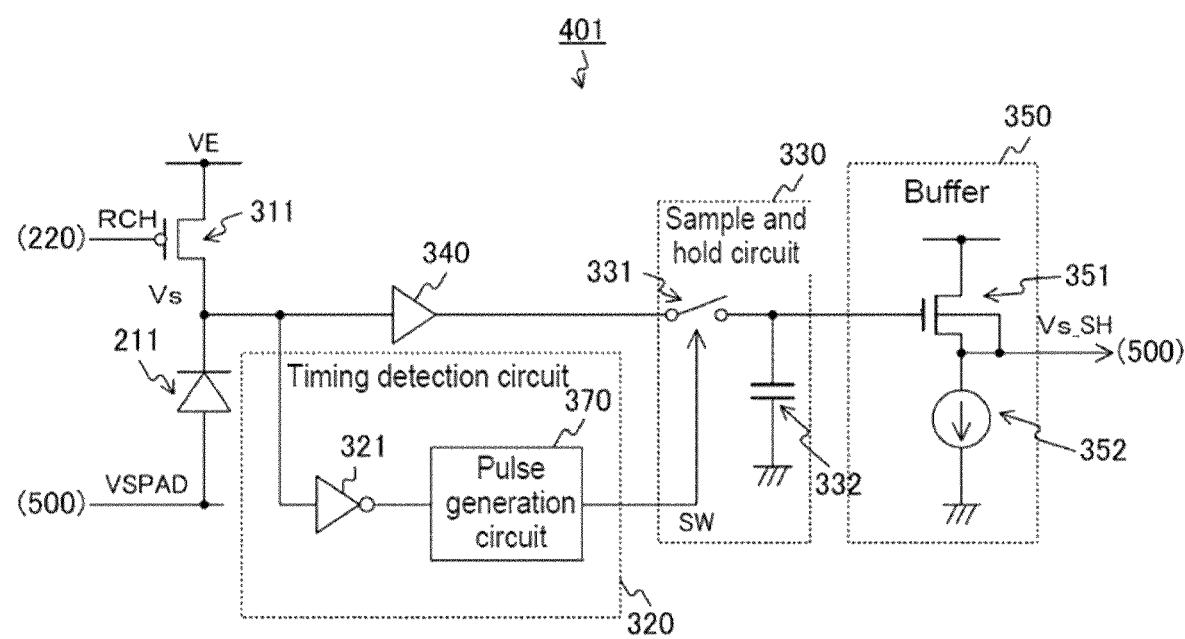

[Fig. 8]
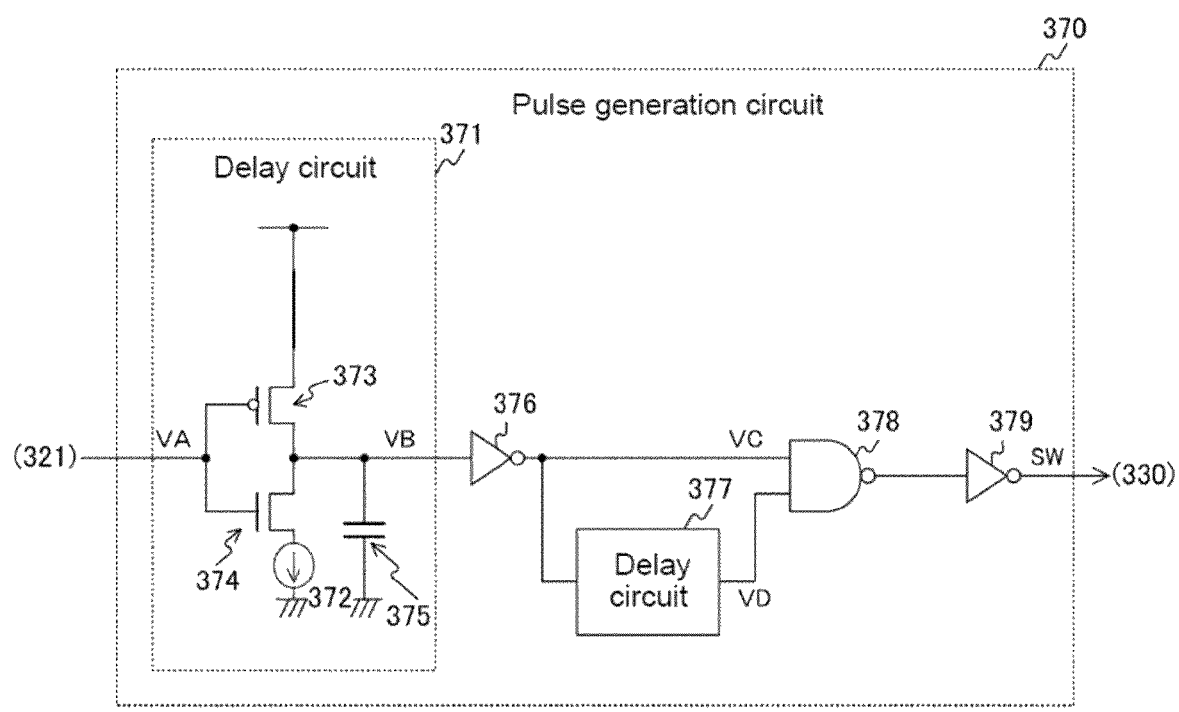

[Fig. 9]
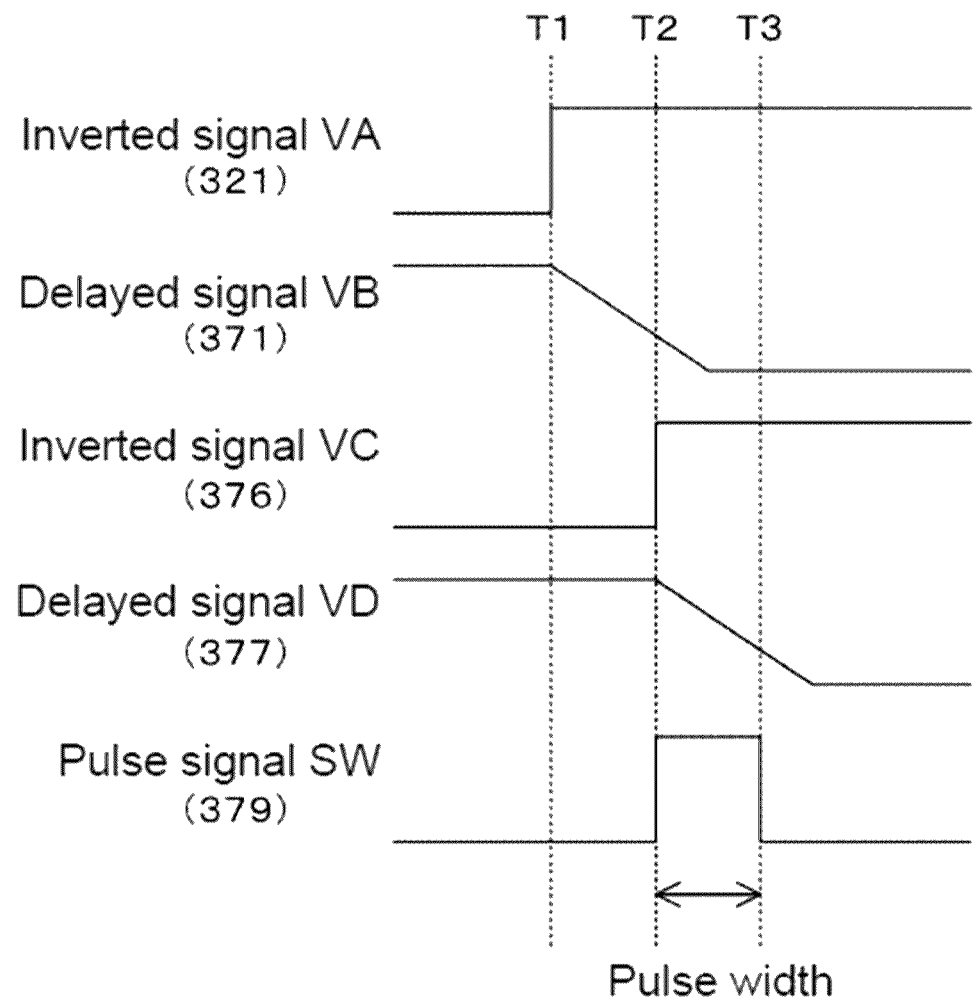

[Fig. 10]
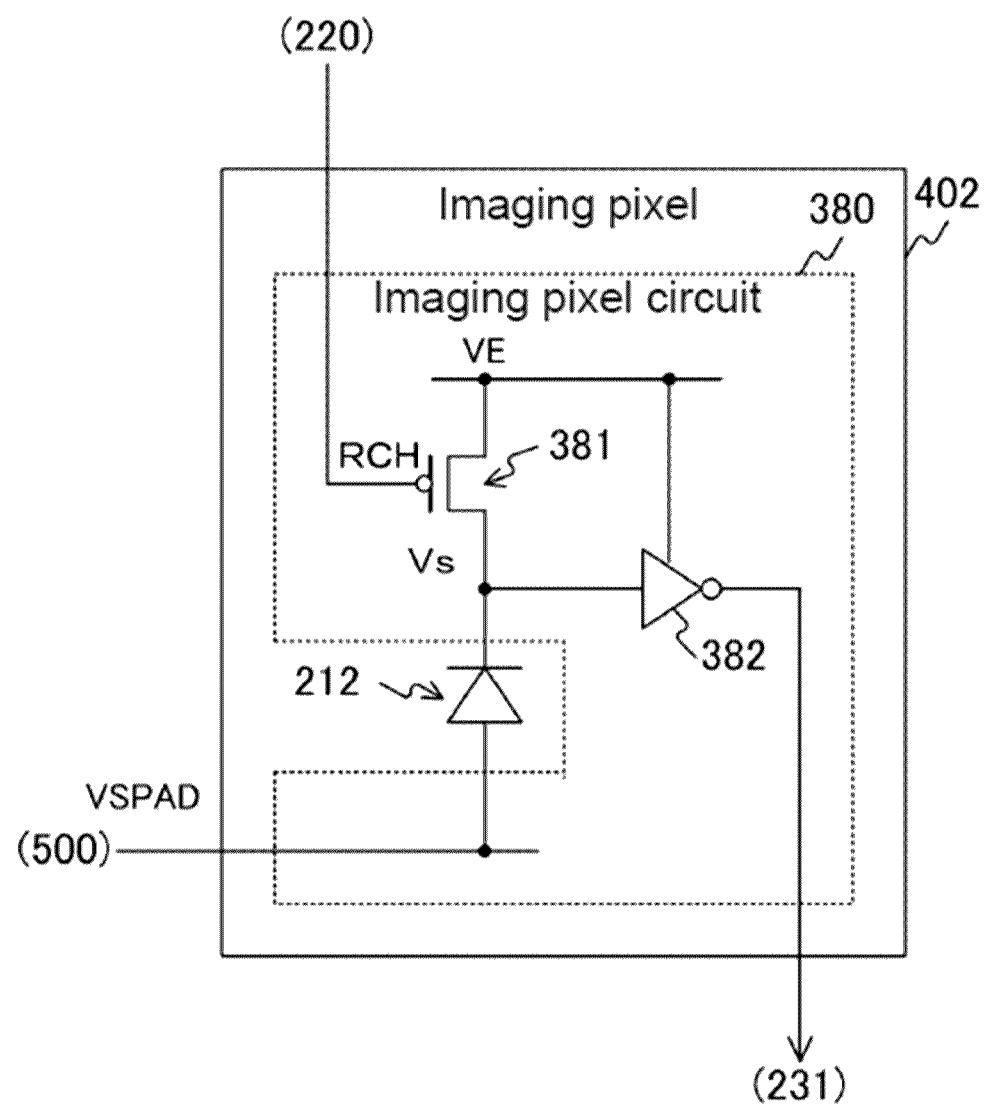

[Fig. 11]
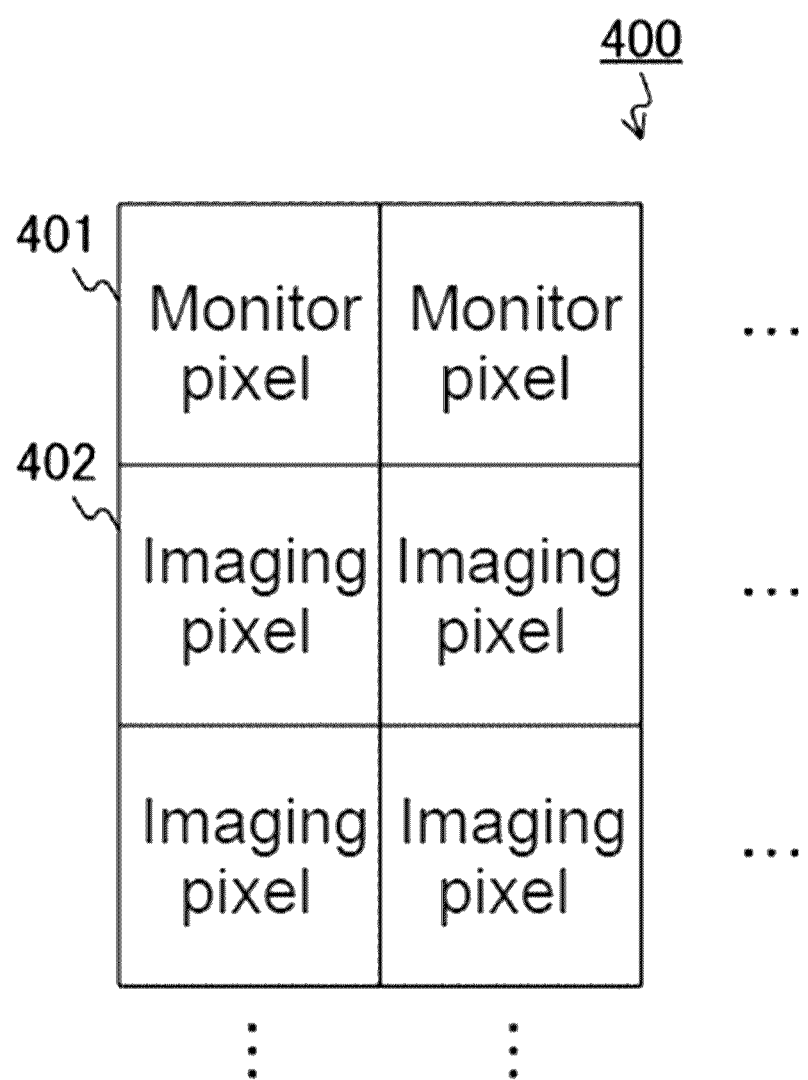

[Fig. 12]
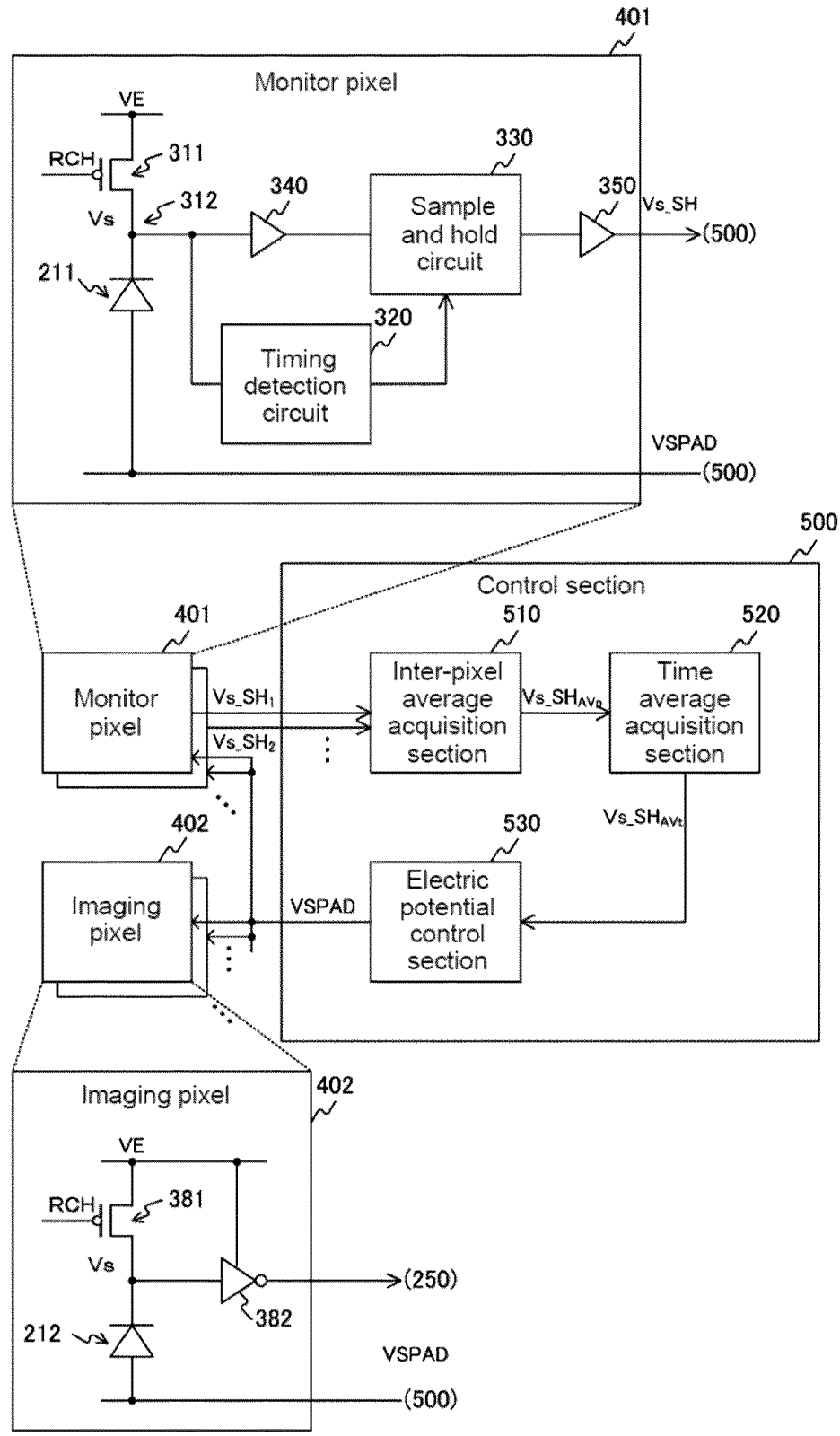

[Fig. 13]
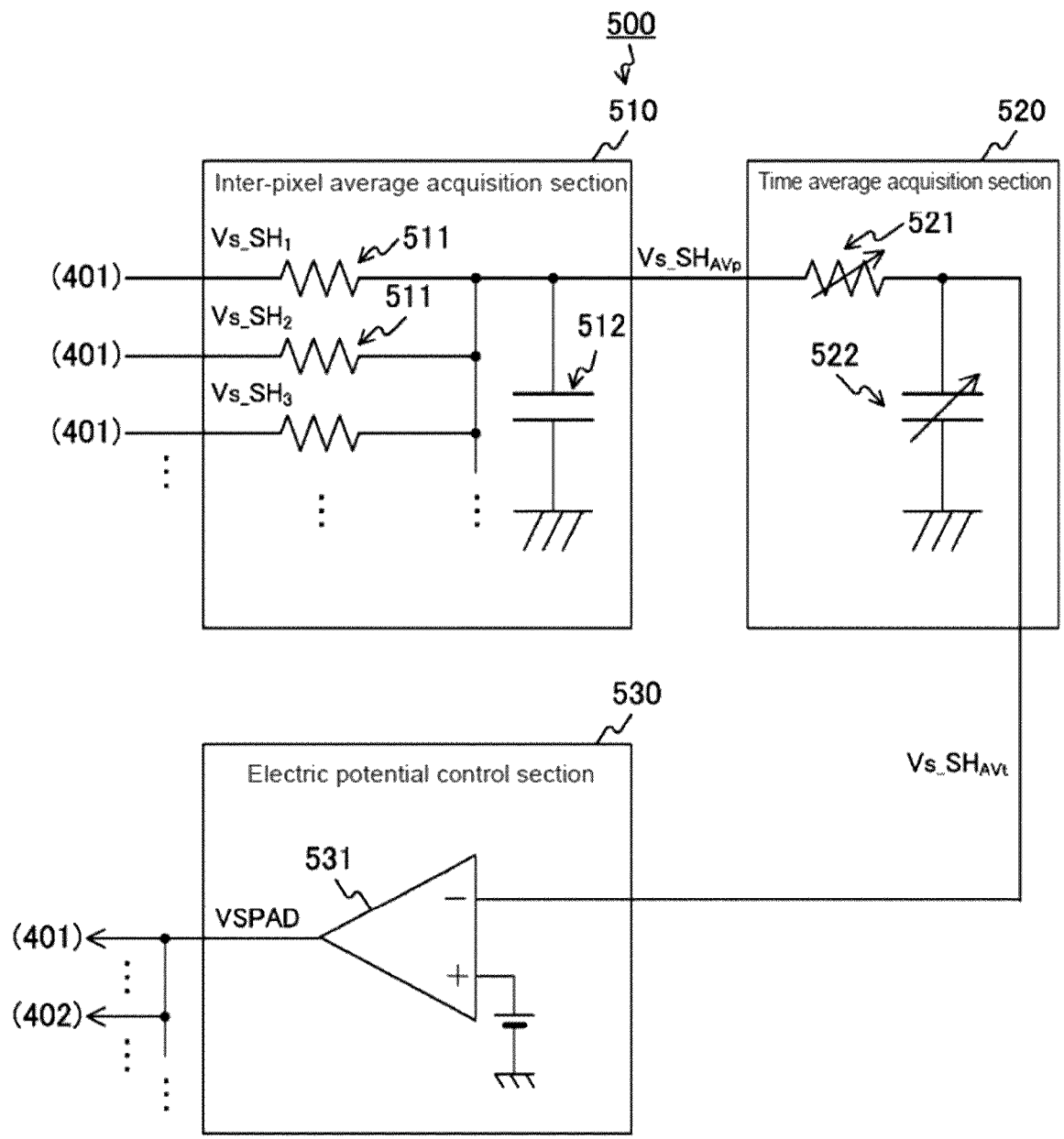

[Fig. 14]
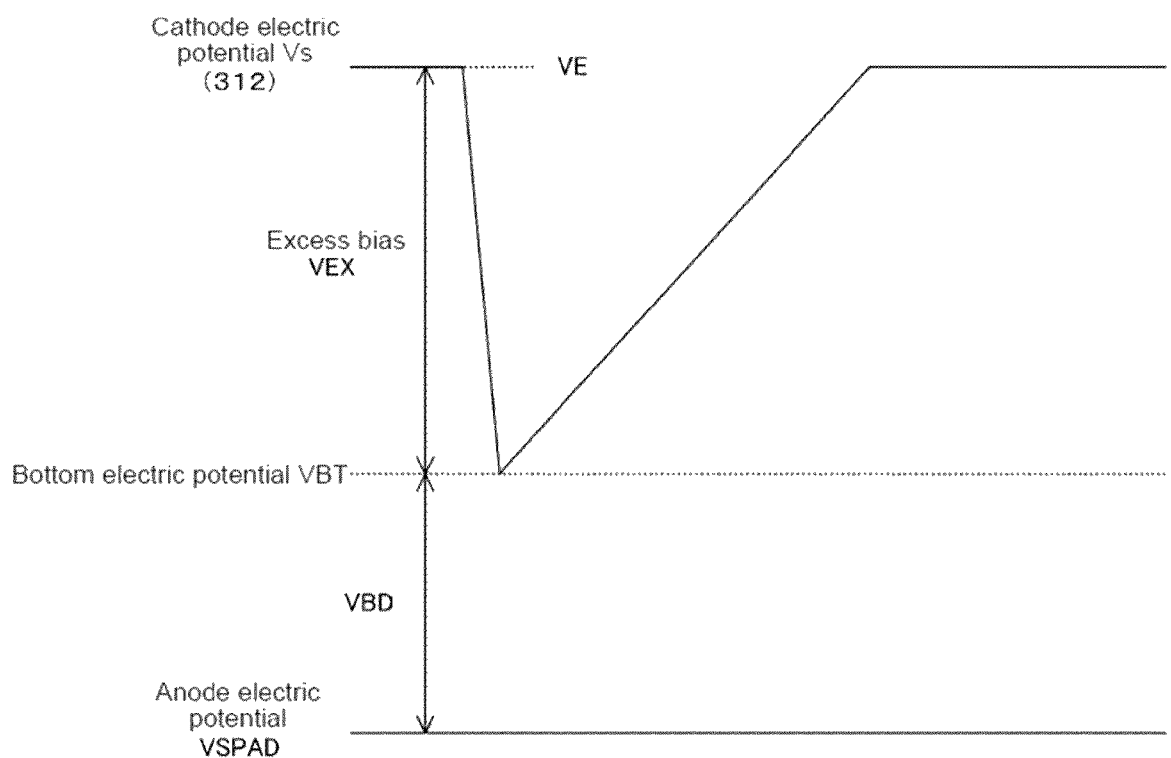

[Fig. 15A]
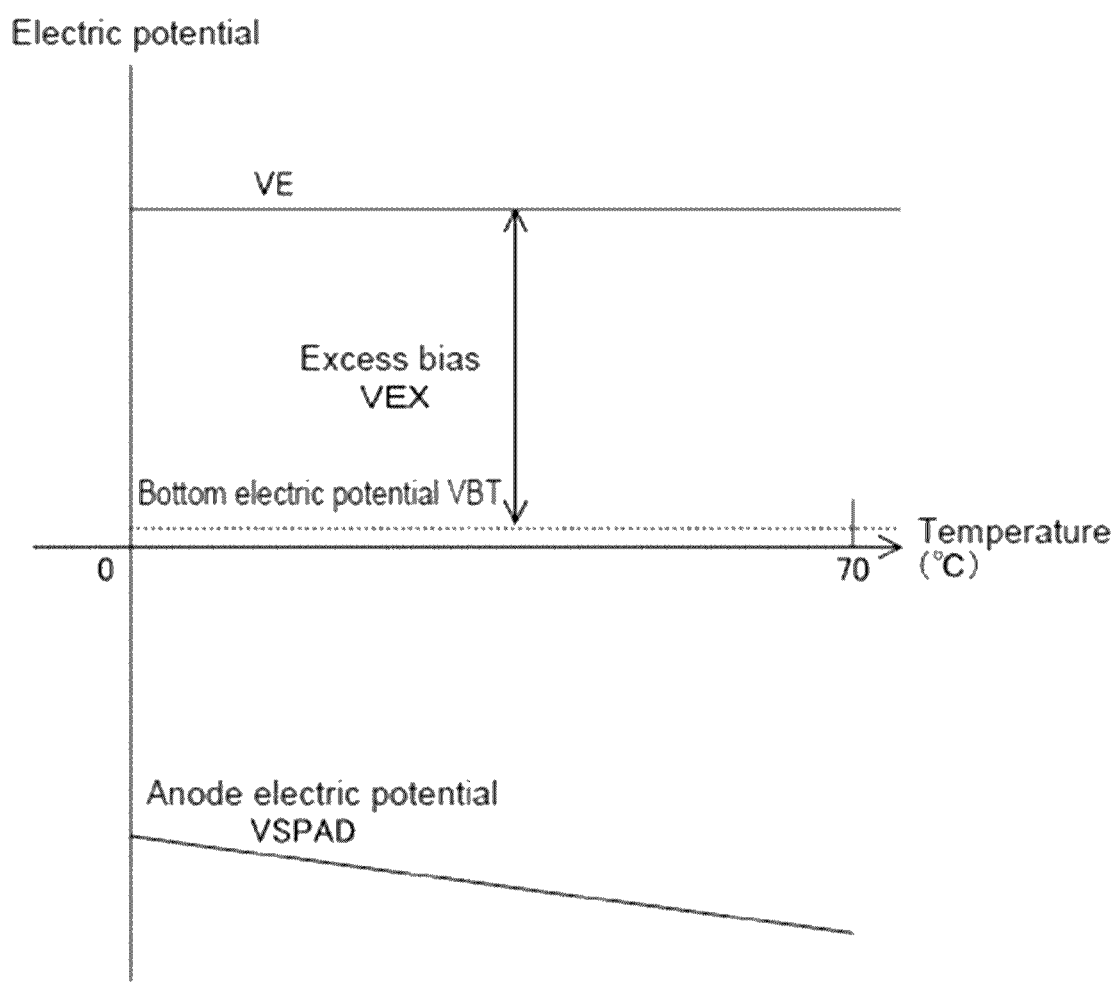

[Fig. 15B]
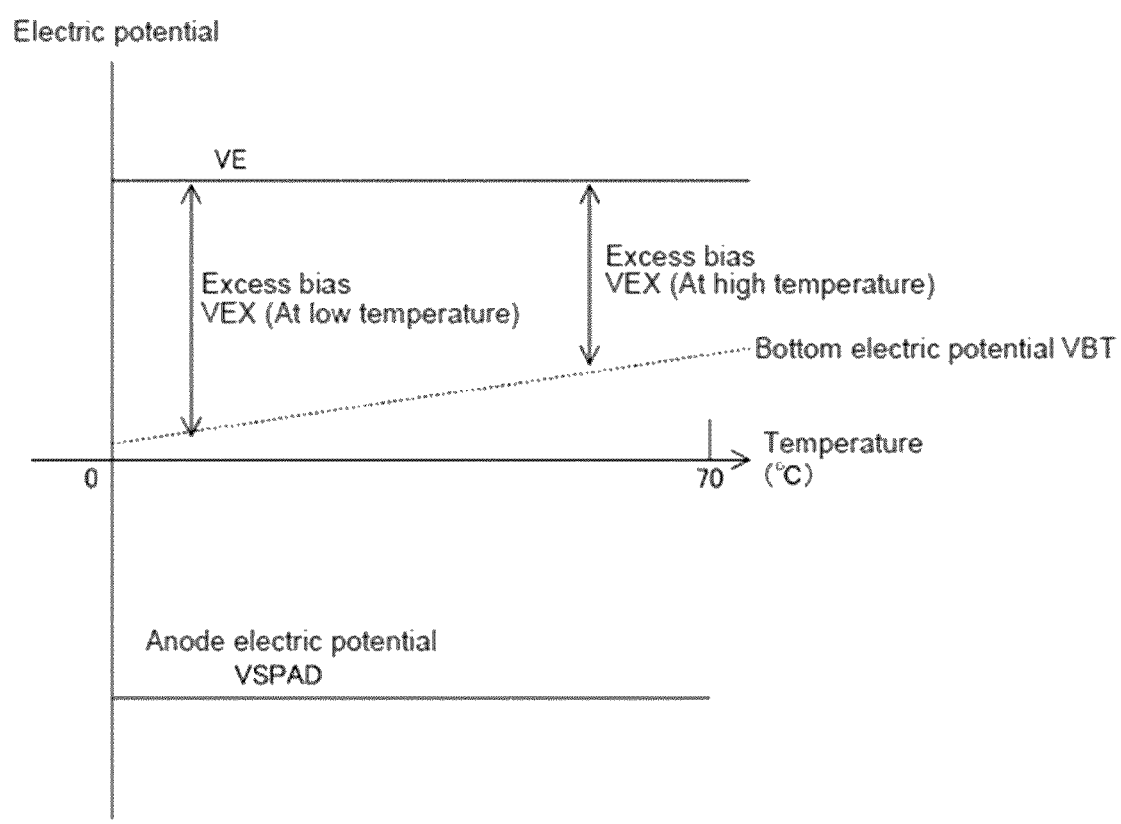

[Fig. 16A]
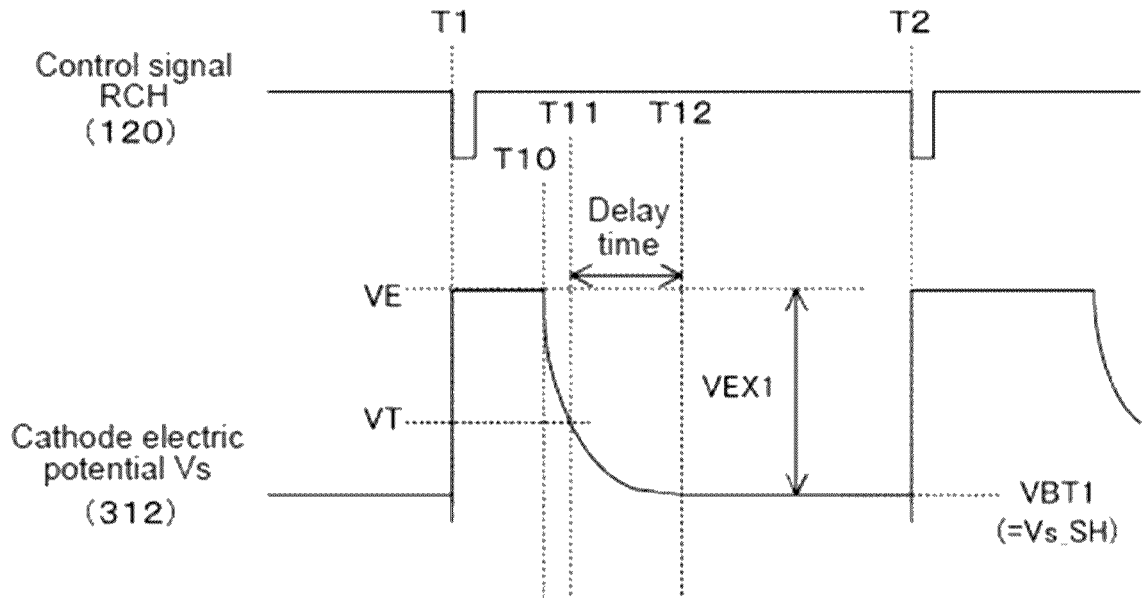
[Fig. 16B]
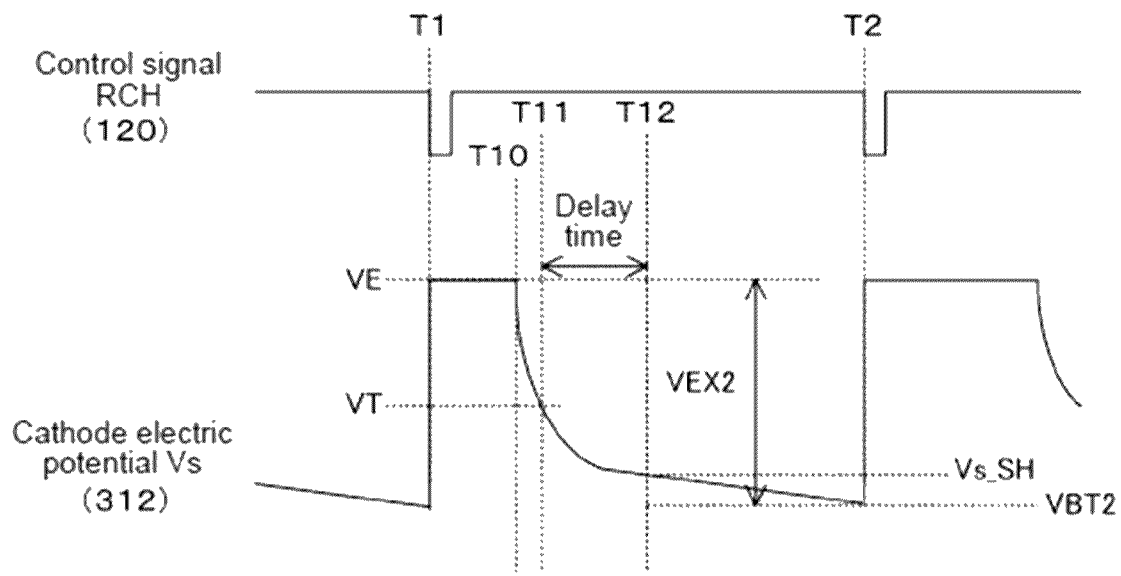

[Fig. 17A]
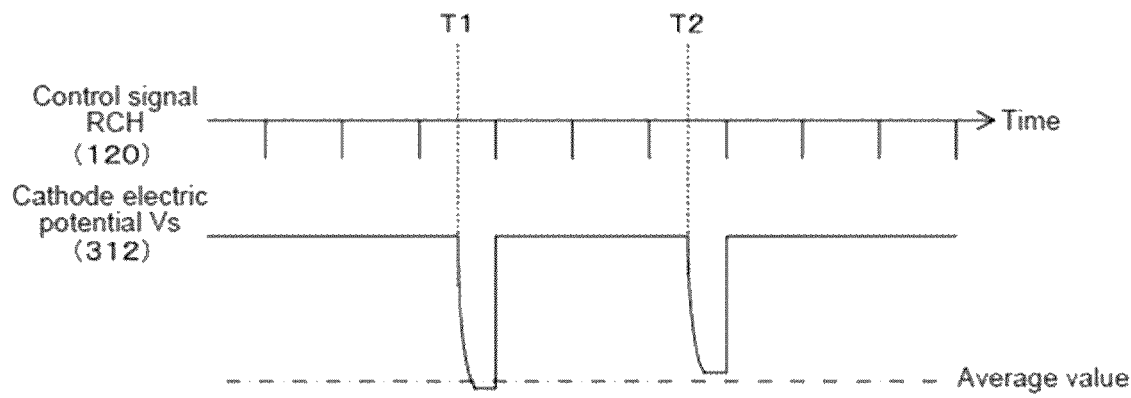
[Fig. 17B]
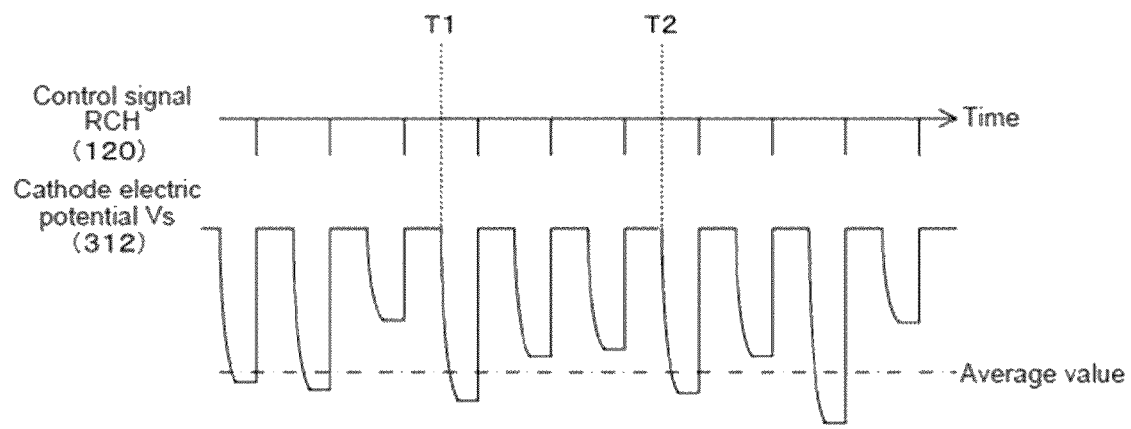

[Fig. 18]
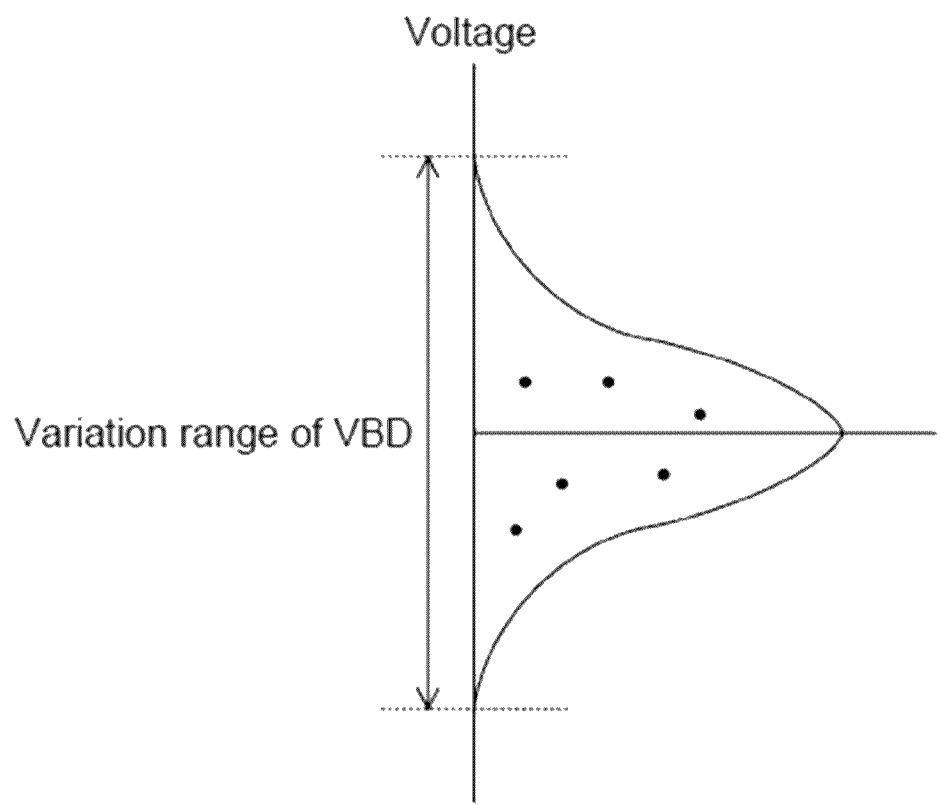

[Fig. 19]
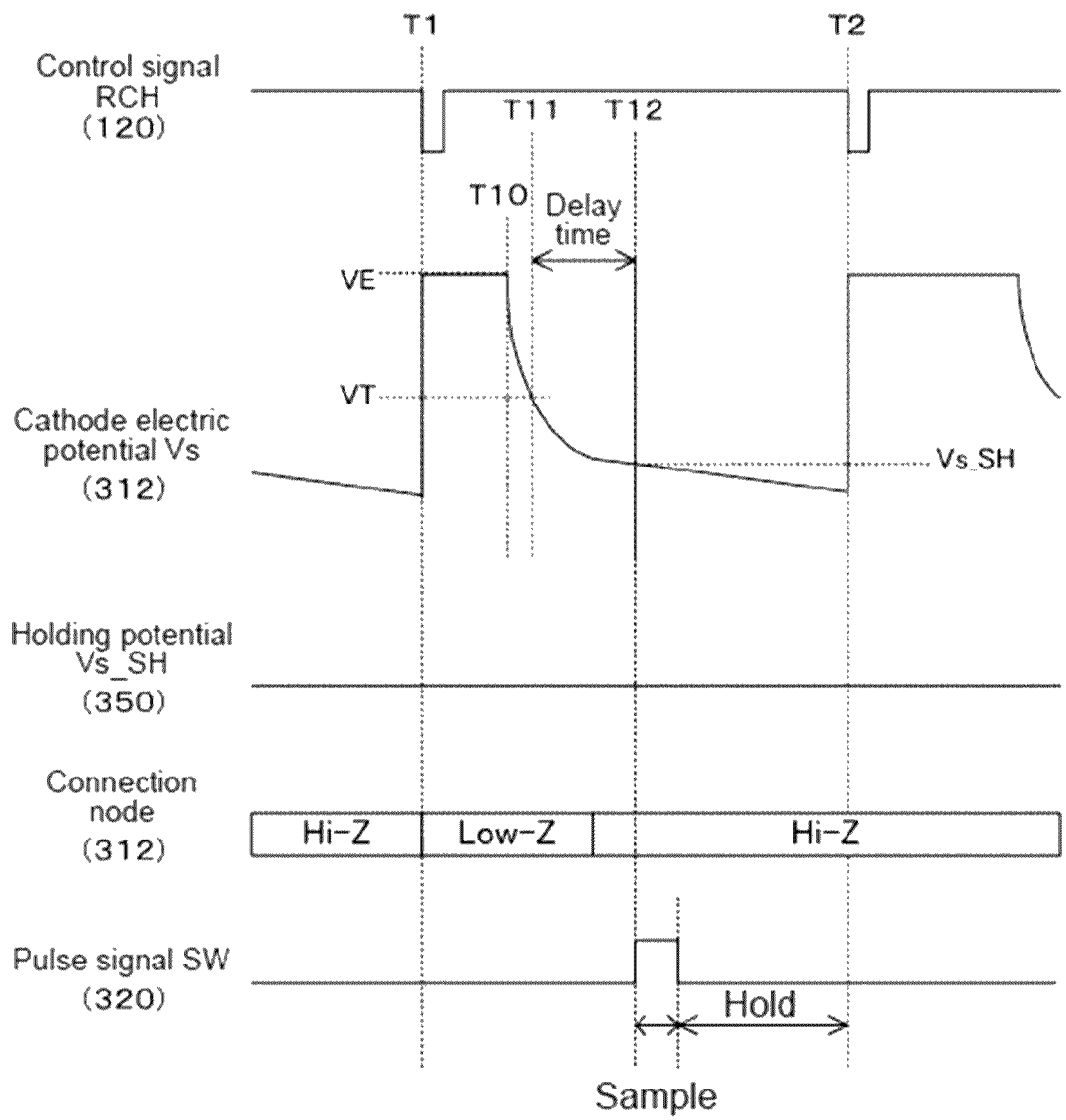

[Fig. 20]
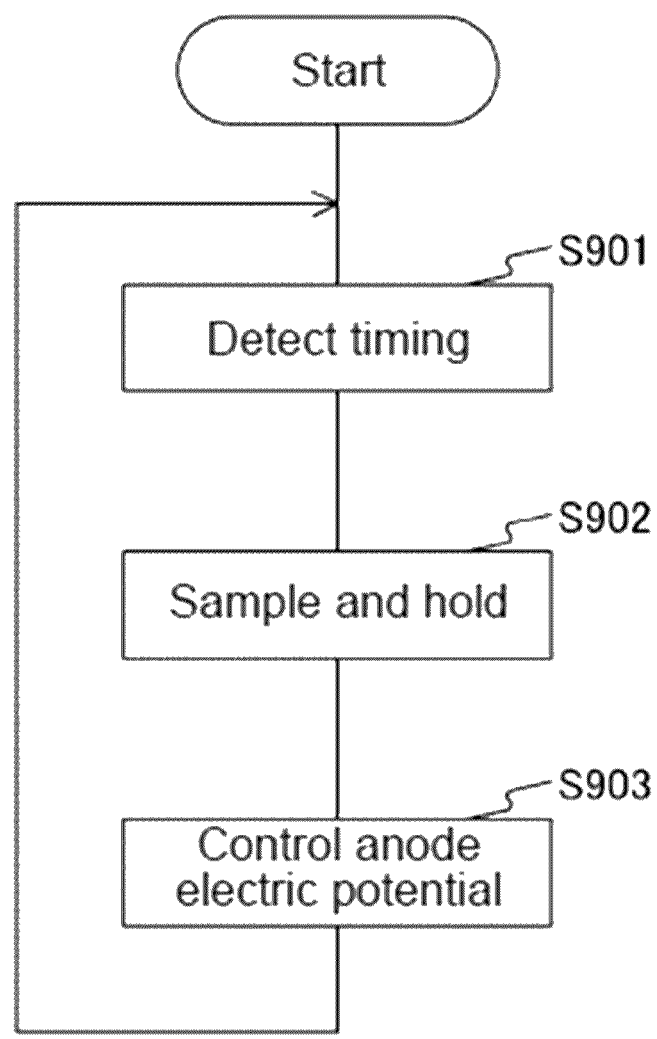

[Fig. 21]
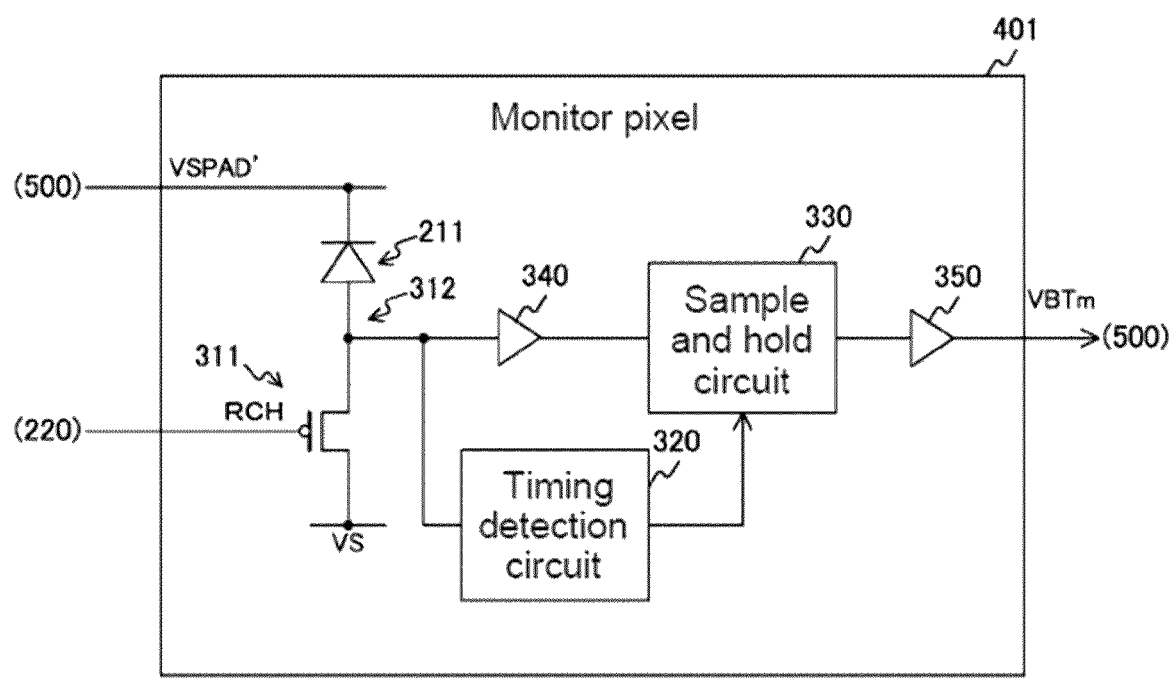

[Fig. 34]
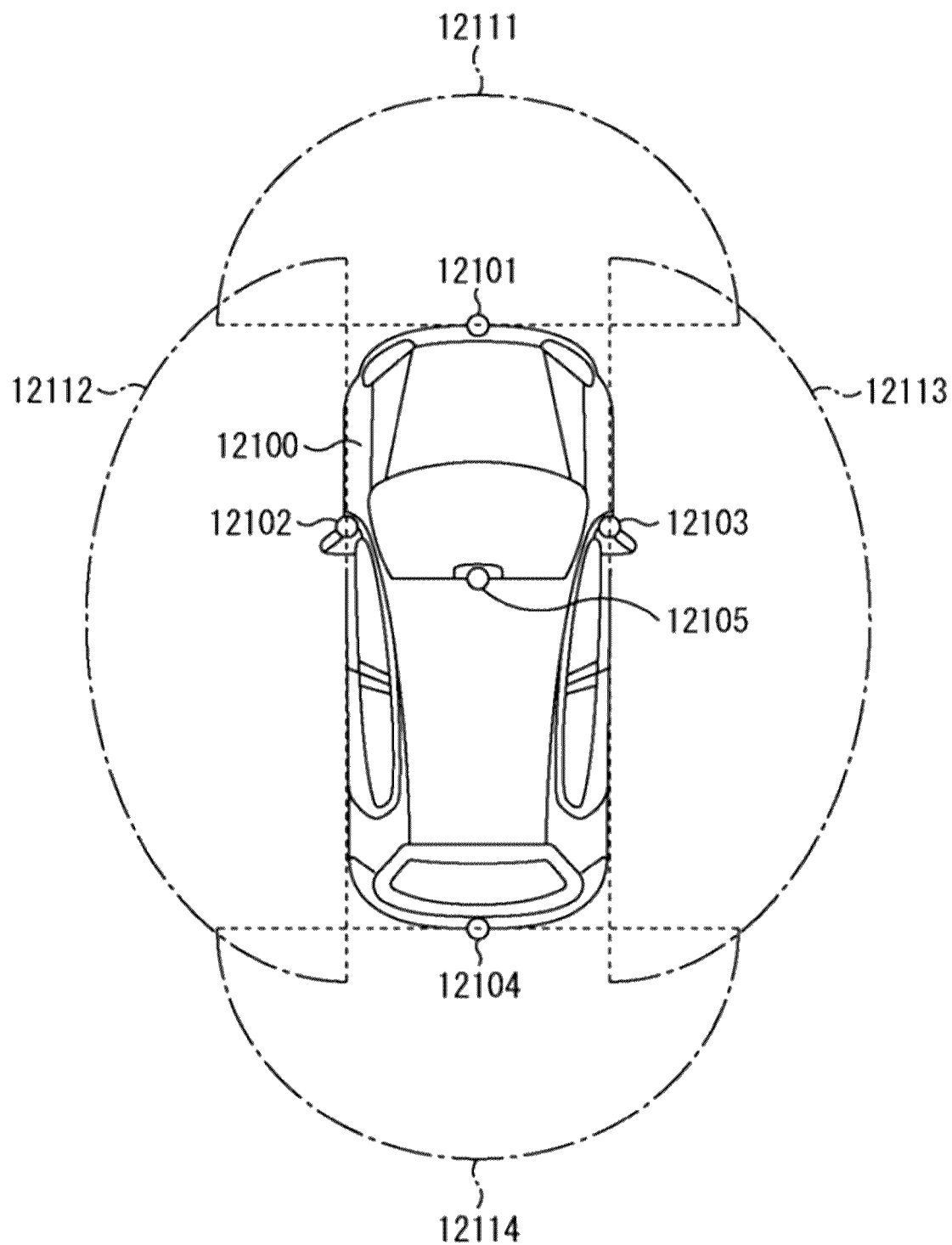

LIGHT DETECTING DEVICE AND SYSTEM

CROSS REFERENCE TO RELATED APPLICATIONS

This application is a national stage application under 35 U.S.C. 371 and claims the benefit of PCT Application No. PCT/JP2020/023498, having an international filing date of 16 Jun. 2020, which designated the United States, which PCT application claimed the benefit of Japanese Patent Application No. 2019-176633, filed 27 Sep. 2019, the entire disclosures of each of which are incorporated herein by reference.

TECHNICAL FIELD

The present technology relates to a light detecting device. Specifically, the present technology relates to the light detecting device and the system for measuring a distance to an object.

BACKGROUND ART

In the past, ranging methods called time of flight (ToF) have been known with regard to electronic devices having ranging functions. The ToF is a method of measuring a distance by causing the electronic device to emit irradiation light to an object, and calculating a round-trip time between the emission of the irradiation light and return of reflected irradiation light to the electronic device. In many cases, a single-photon avalanche diode (SPAD) is used as a photoelectric conversion element when detecting the reflected light corresponding to the irradiation light. However, when using the SPAD, sometimes excess bias varies depending on temperature. The excess bias is a value obtained by subtracting breakdown voltage from voltage between an anode and a cathode. Therefore, there are a possibility that the excess bias becomes too small and sensitivity of a photodiode decreases, and a possibility that the excess bias becomes too large in reverse and dark-current noise increases. Accordingly, there have been provided solid state image sensors that monitor cathode electric potentials of the SPADs when photocurrent flows and reduce anode electric potentials of the SPADs as the cathode electric potentials get higher.

CITATION LIST

Patent Literature

PTL 1: Japanese Patent Application Laid-open No. 2019-75394

SUMMARY

Technical Problem

The above-listed related technology controls the anode electric potentials to suppress variation in the excess bias caused by change in the temperature. However, monitor voltage (cathode voltage) for controlling the anode electric potentials follows the variation in the excess bias caused by the temperature, and the monitor voltage also varies depending on decrease or increase in an amount of incident light. Although the above-described solid state image sensor makes it possible to suppress variation in the excess bias caused by change in temperature, such a solid state image sensor has a problem of variation in the excess bias caused by variation in the monitor voltage depending on decrease or increase in an amount of incident light.

It is desirable to suppress variation in the excess bias depending on decrease or increase in an amount of incident light by using a solid state image sensor that controls one of an anode electric potential and a cathode electric potential of a photoelectric conversion element on the basis of another of the anode electric potential and the cathode electric potential.

Solution to Problem

According to a first embodiment of the present technology, there is provided a solid state image sensor including: a photoelectric conversion element that includes an anode and a cathode, one of the anode and the cathode being connected to a predetermined node; an electric potential supply element configured to supply a first electric potential to the predetermined node; a timing detection circuit configured to detect a timing at which a predetermined period of time has elapsed since start of an increase or a decrease in an electric potential of the predetermined node from the first electric potential; a sample and hold circuit configured to capture the electric potential of the predetermined node on the basis of output from the timing detection circuit and hold the electric potential as a second electric potential; and a control section configured to control an electric potential of another of the anode and the cathode on the basis of the second electric potential. This makes it possible to suppress variation in excess bias.

In addition, according to the first embodiment, the timing detection circuit may include an inverter configured to invert a signal of the electric potential of the predetermined node and output the inverted signal. This makes it possible to detect a timing on the basis of the inverted signal.

In addition, according to the first embodiment, the timing detection circuit may further include a pulse signal generation circuit configured to generate a pulse signal on the basis of a signal obtained by delaying the inverted signal by predetermined delay time, and the sample and hold circuit may capture the electric potential of the predetermined node within a time period of a pulse width of the pulse signal. This makes it possible to sample a cathode electric potential by using the pulse signal.

In addition, according to the first embodiment, the timing detection circuit may further include a delay circuit configured to delay the inverted signal by predetermined delay time and output a delayed signal, and the sample and hold circuit may capture the electric potential of the predetermined node in the case where the delayed signal is one of two values that are different from each other, and hold the captured electric potential in the case where the delayed signal is another of the two values. This makes it possible to sample a cathode electric potential by using the delayed signal.

In addition, according to the first embodiment, the photoelectric conversion element, the timing detection circuit, and the sample and hold circuit may be installed in a pixel, the installation being performed with respect to a plurality of the pixels, and the control section may include an inter-pixel average acquisition section configured to calculate, as an inter-pixel average, an average of the respective second electric potentials of the plurality of the pixels, and a time average acquisition section configured to calculate a time average of the inter-pixel average, and an electric potential control section configured to control the electric potential of the other of the anode and the cathode in a manner that the electric potential becomes lower as the time average gets higher. This makes it possible to suppress bad influences caused by variation in the second electric potential.

In addition, according to the first embodiment, the time average acquisition section may include an analog filter configured to generate the time average. This makes it possible to obtain the time average by using an analog circuit.

In addition, according to the first embodiment, the time average acquisition section may include a digital filter configured to generate the time average. This makes it possible to reduce the size of a footprint.

In addition, according to the first embodiment, the electric potential control section may include an amplifier configured to compare the time average with a predetermined power source electric potential, and output a result of the comparison to the other of the anode and the cathode. This makes it possible to control electric potentials by using an analog circuit.

In addition, according to the first embodiment, the electric potential control section may include a power semiconductor configured to control the electric potential of the other of the anode and the cathode in a manner that the electric potential becomes lower as the time average gets higher. This makes it possible to reduce the size of a footprint.

In addition, according to the first embodiment, the inter-pixel average acquisition section may include a capacitor, and a plurality of resistors connected in parallel between the plurality of the pixels and the capacitor. This makes it possible to obtain an inter-pixel average by using an analog circuit.

In addition, according to the first embodiment, the inter-pixel average acquisition section may include an analog-to-digital conversion section configured to convert the second electric potentials into digital signals, and an averaging filter configured to calculate an average of the digital signals as the inter-pixel average. This makes it possible to reduce the size of a footprint.

In addition, according to the first embodiment, the analog-to-digital conversion section may include a plurality of analog-to-digital converters configured to convert the second electric potentials of the pixels that are different from each other into the digital signals. This makes it possible to simultaneously convert the plurality of second electric potentials into the digital signals.

In addition, according to the first embodiment, the analog-to-digital conversion section may include a selector configured to select any of the respective second electric potentials of the plurality of the pixels, and an analog-to-digital converter configured to convert the selected second electric potential into the digital signal. This makes it possible to reduce the number of analog-to-digital converters.

In addition, according to the first embodiment, the solid state image sensor may further include an output-side buffer interposed between the sample and hold circuit and the control section. This makes it possible to output the second electric potential via the output-side buffer.

In addition, according to the first embodiment, the output-side buffer may generate a differential signal on the basis of the second electric potential, and output the generated differential signal. This makes it possible to obtain a more accurate output value.

In addition, according to the first embodiment, the solid state image sensor may further include an input-side buffer interposed between the predetermined node and the sample and hold circuit. This allows both monitor pixels and imaging pixels to have same breakdown voltage VBD.

In addition, according to the first embodiment, the input-side buffer may generate a differential signal on the basis of the second electric potential, and output the generated differential signal. This makes it possible to obtain a more accurate output value.

In addition, according to the first embodiment, the photoelectric conversion element and the electric potential supply element may be installed in each of an imaging pixel circuit and a monitor pixel circuit around the imaging pixel circuit, and the timing detection circuit and the sample and hold circuit may be installed in the monitor pixel circuit. This makes it possible to control an electric potential of an anode or a cathode on the basis of the electric potential held by the monitor pixel circuit.

In addition, according to the first embodiment, the cathode may be connected to the predetermined node, and the control section may control an electric potential of the anode. This makes it possible to control an anode electric potential in response to a cathode electric potential.

In addition, according to the first embodiment, the anode may be connected to the predetermined node, and the control section may control an electric potential of the cathode. This makes it possible to control a cathode electric potential in response to an anode electric potential.

In addition, according to a second embodiment of the present technology, there is provided a ranging system including: a light emission section configured to supply irradiation light; and a solid state image sensor that includes a photoelectric conversion element including an anode and a cathode, one of the anode and the cathode being connected to a predetermined node, an electric potential supply element configured to supply a first electric potential to the predetermined node, a timing detection circuit configured to detect a timing at which a predetermined period of time has elapsed since start of an increase or a decrease in an electric potential of the predetermined node from the first electric potential, a sample and hold circuit configured to capture the electric potential of the predetermined node on the basis of output from the timing detection circuit and hold the electric potential as a second electric potential, a control section configured to control an electric potential of another of the anode and the cathode on the basis of the second electric potential, and a ranging section configured to measure a distance on the basis of a round-trip time between a light emission timing of the irradiation light and a light reception timing of reflected light corresponding to the irradiation light. This makes it possible to suppress variation in excess bias and improve ranging accuracy.

According to an embodiment of the present technology, a light detecting device includes first pixel circuitry including a first avalanche photodiode, and second pixel circuitry including a second avalanche photodiode, a first delay circuit including an input coupled to a cathode of the second avalanche photodiode, a first circuit including a first input coupled to the cathode of the second avalanche photodiode, and a second input coupled to an output of the first delay circuit. The light detecting device includes a control circuit coupled to an output of the first circuit and configured to control a potential of an anode of the first avalanche photodiode based on the output of the first circuit. The control circuit is configured to control a potential of an anode of the second avalanche photodiode based on the output of the first circuit. The light detecting device further includes third pixel circuitry including a third avalanche photodiode, a second delay circuit including an input coupled to a potential of a cathode of the third avalanche photodiode, and a second circuit including a third input coupled to the cathode of the third avalanche photodiode, and a fourth input coupled to an output of the second delay circuit. The control circuit includes an averaging circuit coupled to the output of the first circuit and an output of the second circuit and is configured to average the outputs of the first circuit and the second circuit to output an inter-pixel average signal. The control circuit includes a time averaging circuit including an input coupled to an output of the averaging circuit and is configured to output a time-averaged signal based on the inter-pixel average signal. The control circuit includes a potential controller coupled to the anode of the first avalanche photodiode. The potential controller is configured to control the potential of the anode of the first avalanche photodiode to be lower as the time-averaged signal rises, and the potential controller is configured to control the potential of the anode of the first avalanche photodiode to be higher as the time-averaged signal lowers. The control circuit includes an analog-to-digital converter configured to convert the time-averaged signal into a digital signal, and the potential controller includes power electronics configured to control the potential of the anode of the first avalanche photodiode based on the digital signal. The averaging circuit includes a capacitance, a first resistance coupled between the capacitance and the first delay circuit, and a second resistance coupled between the capacitance and the second delay circuit. The first circuit includes a holding circuit including a switch and a capacitance. The first circuit includes a first buffer circuit and a second buffer circuit. The first buffer circuit is coupled between the cathode of the second avalanche photodiode and the holding circuit, and the holding circuit is coupled between the first buffer circuit and the second buffer circuit. The first buffer circuit is configured to buffer the potential of the cathode of the second avalanche photodiode to output a first pair of differential signals including a first positive signal and a first negative signal, the holding circuit is configured to output the first positive signal according to the first delay signal, and the second buffer circuit is configured to buffer the first negative signal and the first positive signal to output a second pair differential signals including a second positive signal and a second negative signal. The control circuit includes an averaging circuit including an analog-to-digital converter (ADC) including a first input configured to receive the second positive signal, a second input configured to receive the second negative signal, and an output configured to output a digital signal based on the second positive signal and the second negative signal. The control circuit includes a first capacitance coupled to the first input of the ADC, and a second capacitance coupled to the second input of the ADC. The first buffer circuit includes a first current source and a first transistor coupled to the first current source, and a second current source and a second transistor coupled to the second current source. The first transistor is coupled to a node configured to receive the potential of the cathode of the second avalanche photodiode, and is configured to output the first positive signal according to current from the first current source, and the second transistor is coupled to a node configured to receive a ground signal, and is configured to output the first negative signal according to current from the second current source. The second buffer circuit includes a third current source and a third transistor coupled to the third current source, and a fourth current source and a fourth transistor coupled to the fourth current source. The third transistor is configured to receive the first positive signal and output the second positive signal according to current from the third current source, and the fourth transistor is configured to receive the first negative signal and output the second negative signal according to current from the fourth current source. According to an embodiment of the present technology, a light detecting device includes first pixel circuitry including a first avalanche photodiode, and second pixel circuitry including a second avalanche photodiode, a first delay circuit configured to generate a first delay signal based on a first potential of a cathode of the second avalanche photodiode, and a first circuit configured to sample a second potential of the cathode of the second avalanche photodiode and output the sampled second potential based on the first delay signal. The light detecting device includes a control circuit configured to control a potential of an anode of the first avalanche photodiode based on the sampled second potential output by the first circuit. According to an embodiment of the present technology, a system includes a light source, and a light detecting device, including first pixel circuitry including a first avalanche photodiode, and second pixel circuitry including a second avalanche photodiode, a first delay circuit including an input coupled to a cathode of the second avalanche photodiode, and a first circuit including a first input coupled to the cathode of the second avalanche photodiode, and a second input coupled to an output of the first delay circuit. The system includes a control circuit coupled to an output of the first circuit and configured to control a potential of an anode of the first avalanche photodiode based on the output of the first circuit. According to an embodiment of the present technology, a light detecting device includes first pixel circuitry including a first avalanche photodiode, and second pixel circuitry including a second avalanche photodiode, a first delay circuit including an input coupled to an anode of the second avalanche photodiode, a first circuit including a first input coupled to the anode of the second avalanche photodiode, and a second input coupled to an output of the first delay circuit, and a control circuit coupled to an output of the first circuit and configured to control a potential of a cathode of the first avalanche photodiode based on the output of the first circuit.

Advantageous Effects of Invention

The monitor pixel detects a timing at which a predetermined period of time has elapsed since decrease in a cathode electric potential, and captures and holds the cathode electric potential at that timing. This makes it possible to hold the electric potential without depending on an amount of light. It is possible to suppress variation in bias voltage resulting from decrease or increase in the amount of light, when the control section controls an anode electric potential in response to the holding potential.

BRIEF DESCRIPTION OF DRAWINGS

FIG. 1 is a block diagram illustrating a configuration example of a ranging module according to a first embodiment of the present technology.

FIG. 2 is a diagram illustrating an example of a stacking structure of a solid state image sensor according to the first embodiment of the present technology.

FIG. 3 is a plan view illustrating a configuration example of a pixel chip according to the first embodiment of the present technology.

FIG. 4 is a block diagram illustrating a configuration example of a circuit chip according to the first embodiment of the present technology.

FIG. 5 is a block diagram illustrating a configuration example of a circuit block according to the first embodiment of the present technology.

FIG. 6 is a block diagram illustrating a configuration example of a monitor pixel according to the first embodiment of the present technology.

FIG. 7 is a circuit diagram illustrating the configuration example of the monitor pixel according to the first embodiment of the present technology.

FIG. 8 is a circuit diagram illustrating a configuration example of a pulse generation circuit according to the first embodiment of the present technology.

FIG. 9 is a timing diagram illustrating an example of operation of the pulse generation circuit according to the first embodiment of the present technology.

FIG. 10 is a circuit diagram illustrating a configuration example of an imaging pixel according to the first embodiment of the present technology.

FIG. 11 is a plan view illustrating a configuration example of a pixel array section according to the first embodiment of the present technology.

FIG. 12 is a block diagram illustrating a configuration example of the monitor pixels, the imaging pixels, and a control section according to the first embodiment of the present technology.

FIG. 13 is a circuit diagram illustrating a configuration example of the control section according to the first embodiment of the present technology.

FIG. 14 is a diagram illustrating an example of variation in a cathode electric potential and an anode electric potential according to the first embodiment of the present technology.

FIG. 15A is a diagram illustrating an example of variation in excess bias VEX and an anode electric potential VSPAD according to the first embodiment.

FIG. 15B is a diagram illustrating an example of variation in excess bias VEX according to the comparative example in which the anode electric potential VSPAD is not controlled.

FIG. 16A is a timing diagram illustrating variation in the cathode electric potential Vs obtained in the case of a relatively small amount of light.

FIG. 16B is a timing diagram illustrating variation in the cathode electric potential Vs obtained in the case of a relatively large amount of light.

FIG. 17A is a timing diagram illustrating an example of fluctuations in the bottom electric potential VBT obtained in the case of the small amount of light.

FIG. 17B is a timing diagram illustrating an example of fluctuations in the bottom electric potential VBT obtained in the case of the large amount of light.

FIG. 18 is a scatter plot illustrating an example of a variation range of breakdown voltage according to the first embodiment of the present technology.

FIG. 19 is a timing diagram illustrating an example of operation of the monitor pixel and the control section according to the first embodiment of the present technology.

FIG. 20 is a flowchart illustrating an example of operation of the solid state image sensor according to the first embodiment of the present technology.

FIG. 21 is a block diagram illustrating a configuration example of a monitor pixel according to a first modification of the first embodiment of the present technology.

FIG. 34 is a diagram of assistance in explaining an example of installation positions of an outside-vehicle information detecting section and an imaging section.

DESCRIPTION OF EMBODIMENTS

Figure 22:
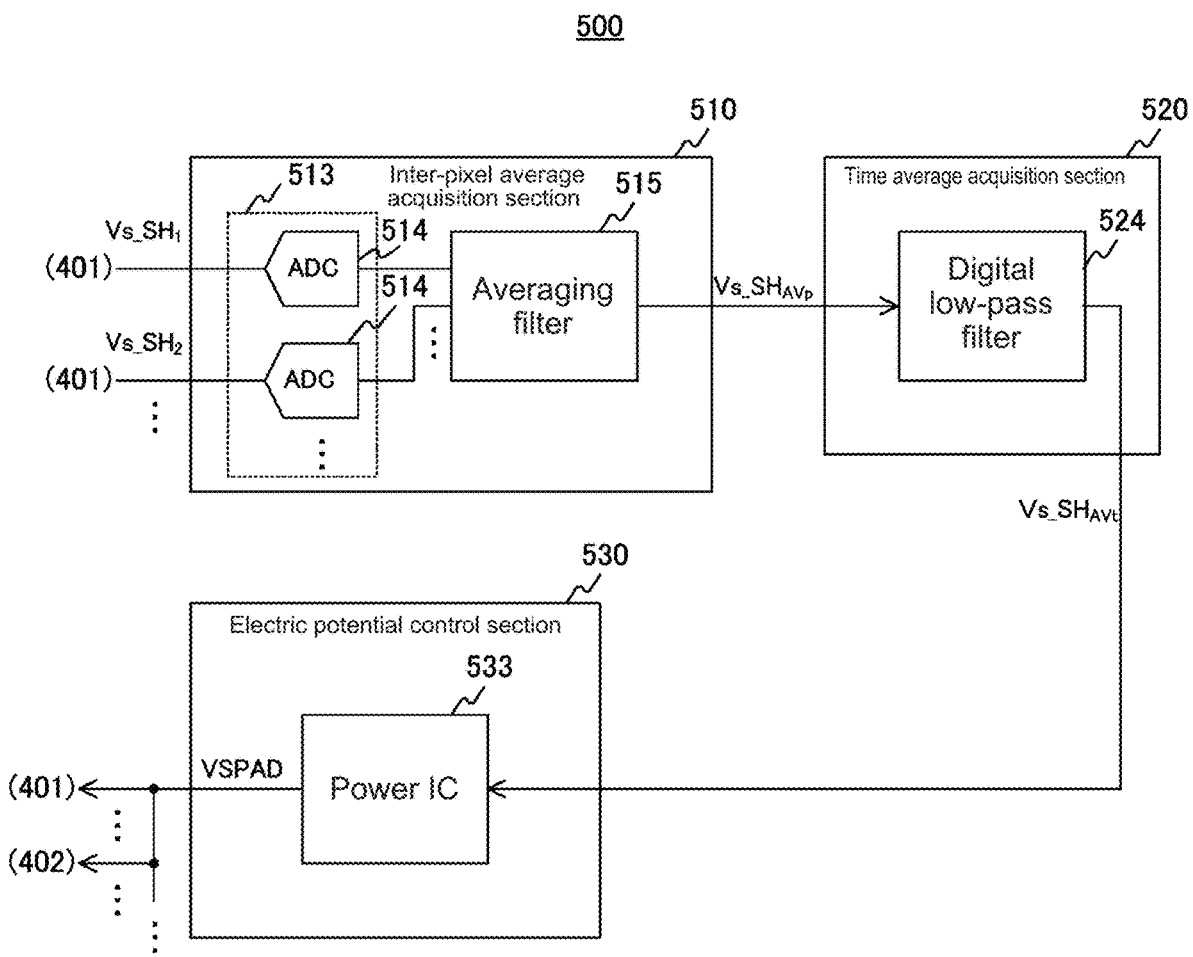
FIG. 22 is a block diagram illustrating a configuration example of a control section according to a second modification of the first embodiment of the present technology.

Embodiments for implementing the present technology (hereinafter, referred to as embodiments) will be described below. The description will be given in the following order.

1. First Embodiment (Example of Holding Cathode Electric Potential at Detected Timing)
2. Second Embodiment (Example of Omitting Buffer but Holding Cathode Electric Potential of Detected Timing)
3. Application Examples to Mobile Object

First Embodiment

"Configuration Example of Ranging Module"

FIG. 1 is a block diagram illustrating a configuration example of a ranging module 100 according to a first embodiment of the present technology. The ranging module 100 is configured to measure a distance to an object. The ranging module 100 includes a light emission section 110, a synchronization control section 120, and a solid state image sensor (or light detecting device) 200. The ranging module 100 is installed in a smartphone, a personal computer, vehicle-mounted equipment, or the like, and is used for measuring a distance.

The synchronization control section 120 operates the light emission section 110 and the solid state image sensor 200 in synchronization with each other. The synchronization control section 120 supplies a clock signal of predetermined frequency (such as 10 to 20 MHz) as a synchronization signal CLKp to the light emission section 110 and the solid state image sensor 200 via signal lines 128 and 129.

The light emission section 110 supplies intermittent light as irradiation light in synchronization with the synchronization signal CLKp from the synchronization control section 120. For example, near-infrared light is used as the irradiation light.

The solid state image sensor 200 is configured to receive reflected light of the irradiation light and measures a round-trip time between a light emission timing indicated by the synchronization signal CLKp and a light reception timing of the reflected light. The solid state image sensor 200 calculates a distance to an object from the round-trip time, generates distance data indicating the distance, and outputs the distance data.

Note that, although the light emission section 110, the solid state image sensor 200, and the synchronization control section 120 are installed in the same ranging module 100, it is also possible to install them in different apparatuses. A system including the light emission section 110, the solid state image sensor 200, and the synchronization control section 120 is an example of a ranging system according to an embodiment of the present technology.

"Configuration Example of Solid State Image Sensor"

FIG. 2 is a diagram illustrating an example of a stacking structure of the solid state image sensor 200 according to the first embodiment of the present technology. The solid state image sensor 200 includes a circuit chip 202, and a pixel chip 201 stacked above the circuit chip 202. These chips are electrically connected through a connection section such as a via. Note that, these chips may also be connected through Cu—Cu bonding or a bump instead of the via.

FIG. 3 is a plan view illustrating a configuration example of the pixel chip 201 according to the first embodiment of the present technology. The pixel chip 201 includes a rectangular light receiving section 210. In the light receiving section 210, a plurality of photoelectric conversion elements 211 and a plurality of photoelectric conversion elements 212 are arrayed.

The photoelectric conversion elements 211 are linearly arrayed along a boundary of the light receiving section 210. For example, photoelectric conversion elements 211 are arrayed in a line at an upper end of the light receiving section 210. On the other hand, the photoelectric conversion elements 212 are arrayed in a two-dimensional lattice form. Among the photoelectric conversion elements 211 and 212, the photoelectric conversion elements 212 are used for generating pixel data of image data. On the other hand, the photoelectric conversion elements 211 are used for monitoring electric potentials of any of cathodes and anodes (for example, electric potentials of the cathodes).

FIG. 4 is a block diagram illustrating a configuration example of a circuit chip 202 according to the first embodiment of the present technology. The circuit chip 202 includes a timing generation section 220, a circuit block 300, a histogram generation section 250, an output interface 260, multiplexers 231 and 232, and time-to-digital converters 241 and 242.

The timing generation section 220 is configured to generate a control signal RCH in synchronization with the synchronization signal CLKp. The timing generation section 220 supplies the control signal RCH to the circuit block 300.

In the circuit block 300, respective pixel circuits (not illustrated) of a plurality of monitor pixels and a plurality of imaging pixels are arrayed. Details of the respective circuit configurations of the monitor pixels and the imaging pixels will be described later. The imaging pixel generates a pulse signal in response to input of photon, and supplies the generated pulse signal to the multiplexer 231 or 232.

The multiplexer 231 sequentially selects an odd row of the imaging pixels, and supplies pulse signals of the selected row to the time-to-digital converter 241. The multiplexer 232 sequentially selects an even row of the imaging pixels, and supplies pulse signals of the selected row to the time-to-digital converter 242.

The time-to-digital converter 241 is configured to convert time until rise of pulse signals in an odd row into digital signals. The digital signals indicate detection timings of photon. The time-to-digital converter 241 supplies the digital signals to the histogram generation section 250. The time-to-digital converter 242 is configured to convert time until rise of pulse signals in an even row into digital signals. The time-to-digital converter 242 supplies the digital signals to the histogram generation section 250.

The multiplexers 231 and 232 and the time-to-digital converters 241 and 242 make it possible to simultaneously process pulse signals in two rows. Note that, it is also possible for the solid state image sensor 200 to process pulse signals row by row. In this case, a circuit chip includes one of the multiplexers 231/232 and one of the time-to-digital converters 241/242.

The histogram generation section 250 is configured to generate a histogram on the basis of the digital signals from the time-to-digital converters 241 and 242. Here, the histogram is a graph that illustrates detection frequencies of respective detection timings indicated by the digital signals, as frequencies. The histogram generation section 250 generates the histogram for each imaging pixel, and calculates a timing of each peak value as a light reception timing of reflected light. Next, for each imaging pixel, the histogram generation section 250 converts a round-trip time between the light emission timing of irradiation light indicated by the synchronization signal and the light reception timing of the reflected light into a distance to the object. The histogram generation section 250 generates distance data indicating the calculated distance for each imaging pixel, and outputs the distance data to an outside via the output interface 260.

FIG. 5 is a block diagram illustrating a configuration example of the circuit block 300 according to the first embodiment of the present technology. The circuit block 300 includes a plurality of monitor pixel circuits 310, a plurality of imaging pixel circuits 380, and a control section (or control circuit) 500.

The monitor pixel circuit 310 is provided for each photoelectric conversion element 211, and is connected to the corresponding photoelectric conversion element 211. The photoelectric conversion element 211 and the monitor pixel circuit 310 connected to the photoelectric conversion element 211 function as a single monitor pixel. The monitor pixel is a pixel for monitoring electric potentials of any of cathodes and anodes (for example, electric potentials of the cathodes) of the photoelectric conversion elements 211 and 212.

The imaging pixel circuit 380 is provided for each photoelectric conversion element 212, and is connected to the corresponding photoelectric conversion element 212. The photoelectric conversion element 212 and the imaging pixel circuit 380 corresponding to the photoelectric conversion element 212 function as a single imaging pixel. The imaging pixel is a pixel for generating a pulse signal in response to input of photon.

The control section 500 is configured to control electric potentials of any of the cathodes and the anodes (for example, electric potentials of the anodes) of the photoelectric conversion elements 211 and 212 on the basis of monitoring target electric potentials (such as cathodes) of the monitor pixels.

"Configuration Example of Monitor Pixel"

FIG. 6 is a block diagram illustrating a configuration example of a monitor pixel (or first pixel circuitry) 401 according to the first embodiment of the present technology. As described above, a circuit including the photoelectric conversion element 211 of the pixel chip 201 and the monitor pixel circuit 310 of the circuit chip 202 functions as the single monitor pixel 401. In addition, the monitor pixel circuit 310 includes a p-channel metal-oxide-semiconductor (pMOS) transistor 311, a timing detection circuit (or delay circuit) 320, a sample and hold circuit (or holding circuit) 330, and buffers (or buffer circuits) 340 and 350.

The pMOS transistor 311 is interposed between a power source electric potential VE and the photoelectric conversion element 211. In addition, a control signal RCH is input from the timing generation section 220 to a gate of the pMOS transistor 311. When a low-level control signal RCH is input, the pMOS transistor 311 supplies the power source electric potential VE to a connection node 312 to the photoelectric conversion element 211. Note that, the power source electric potential VE is an example of a predetermined electric potential according to an embodiment of the present technology, and the pMOS transistor 311 is an example of an electric potential supply element according to an embodiment of the present technology. In addition, the connection node 312 is an example of a predetermined node according to an embodiment of the present technology.

The photoelectric conversion element 211 is configured to output photocurrent through photoelectric conversion in response to incident photon. For example, the SPAD is used as the photoelectric conversion element 211. A cathode of the photoelectric conversion element 211 is connected to the connection node 312, and a cathode electric potential Vs of the cathode is the monitoring target electric potential. On the other hand, an anode of the photoelectric conversion element 211 is connected to the control section 500, and the control section 500 controls an anode electric potential VSPAD of the anode.

The buffer 340 is interposed between the connection node 312 and the sample and hold circuit 330. Note that, the buffer 340 is an example of an input-side buffer according to an embodiment of the present technology.

The timing detection circuit 320 is configured to monitor the cathode electric potential Vs, and detects a timing at which a predetermined period of time has elapsed since the cathode electric potential Vs started to decrease from the electric potential (that is, the power source electric potential VE) supplied by the pMOS transistor 311. In the case where the cathode electric potential Vs is the monitoring target, the cathode electric potential Vs becomes lower than the power source electric potential VE when photocurrent flows in response to incident photon. Note that, as described later, it is also possible for the monitor pixel 401 to monitor the anode electric potential. In the case where the anode electric potential is monitored, the timing detection circuit 320 detects a timing at which a predetermined period of time has elapsed since the anode electric potential started to increase.

The sample and hold circuit 330 is configured to capture and hold the cathode electric potential Vs on the basis of the timing detected by the timing detection circuit 320. The sample and hold circuit 330 outputs the held electric potential to the buffer 350 as a holding potential Vs_SH.

The buffer 350 is interposed between the sample and hold circuit 330 and the control section 500. Note that, the buffer 350 is an example of an output-side buffer according to an embodiment of the present technology. Note that, the buffer 350 is not necessary, and it is possible to omit the buffer 350. In addition, it is also possible to install two or more buffers 340/350.

FIG. 7 is a circuit diagram illustrating the configuration example of the monitor pixel 401 according to the first embodiment of the present technology. The timing detection circuit 320 includes an inverter 321 and a pulse generation circuit 370. In addition, the sample and hold circuit 330 includes a sample switch 331 and a capacitor 332. The buffer 350 includes an nMOS transistor 351 and an electric current source 352.

The inverter 321 in the timing detection circuit 320 is configured to invert a signal of the cathode electric potential Vs, and output the inverted signal to the pulse generation circuit 370. In addition, the pulse generation circuit 370 is configured to delay the inverted signal from the inverter 321 by predetermined delay time, and generate a pulse signal SW on the basis of the delayed signal. The pulse generation circuit 370 supplies the pulse signal SW to the sample switch 331.

The sample switch 331 in the sample and hold circuit 330 is configured to capture (in other words, sample) the cathode electric potential Vs via the buffer 340 within a time period of a pulse width of the pulse signal SW. The capacitor 332 is configured to hold the sampled cathode electric potential Vs as the holding potential Vs_SH.

In the buffer 350, the nMOS transistor 351 is interposed between a power source electric potential and the electric current source 352. In addition, the holding potential Vs_SH is input from the sample and hold circuit 330 to a gate of the nMOS transistor 351. In addition, a back gate of the nMOS transistor 351 is connected to a connection node between the nMOS transistor 351 and the electric current source 352. The connection node is connected to the control section 500.

Note that, the circuit configuration of the buffer 340 is similar to the buffer 350.

FIG. 8 is a circuit diagram illustrating a configuration example of the pulse generation circuit 370 according to the first embodiment of the present technology. The pulse generation circuit 370 includes a delay circuit 371, an inverter 376, a delay circuit 377, a NOT AND (NAND) gate 378, and an inverter 379. The delay circuit 371 includes an electric current source 372, a pMOS transistor 373, an n-channel metal-oxide-semiconductor (nMOS) transistor 374, and a capacitor 375.

The delay circuit 371 is configured to delay an inverted signal VA from the inverter 321 by predetermined delay time. In the delay circuit 371, the pMOS transistor 373, the nMOS transistor 374 and the electric current source 372 are connected in series between a power source electric potential and a ground electric potential. In addition, gates of the pMOS transistor 373 and the nMOS transistor 374 are connected in common to an output terminal of the inverter 321. The capacitor 375 is interposed between a ground electric potential and a connection node that connects the pMOS transistor 373 to the nMOS transistor 374. In addition, the connection node outputs a delayed signal VB obtained by delaying the inverted signal VA.

The inverter 376 is configured to invert the delayed signal VB. The inverter 376 outputs an inverted signal VC to the delay circuit 377 and the NAND gate 378.

The delay circuit 377 is configured to delay the inverted signal VC by predetermined delay time. The circuit configuration of the delay circuit 377 is similar to the delay circuit 371. The delay circuit 377 outputs a delayed signal VD to the NAND gate 378.

The NAND gate 378 is configured to output a signal of the NAND of the inverted signal VC and the delayed signal VD to the inverter 379 as an output signal.

The inverter 379 is configured to invert the output signal from the NAND gate 378. The inverter 379 outputs the inverted signal to the sample and hold circuit 330 as a pulse signal SW.

FIG. 9 is a timing diagram illustrating an example of operation of the pulse generation circuit 370 according to the first embodiment of the present technology.

It is assumed that, at a timing T1, the inverted signal VA from the inverter 321 rises from a low level to a high level. The delay circuit 371 delays the inverted signal VA, and outputs the delayed signal VB.

In addition, the inverter 376 inverts the delayed signal VB. The inverted signal VC raises at a timing T2. The delay circuit 377 delays the inverted signal VC, and outputs the delayed signal VD.

In addition, at the timing T2, the inverter 379 inverts the NAND of the inverted signal VC and the delayed signal VD and generates the pulse signal SW. The pulse width of the pulse signal SW is a time period between the timing T2 and a timing T3.

"Configuration Example of Imaging Pixel"

FIG. 10 is a circuit diagram illustrating a configuration example of an imaging pixel 402 according to the first embodiment of the present technology. As described above, a circuit including the photoelectric conversion element 212 of the pixel chip 201 and the imaging pixel circuit 380 of the circuit chip 202 functions as the single imaging pixel 402. The imaging pixel circuit 380 includes a pMOS transistor 381 and an inverter 382.

A connection structure between the pMOS transistor 381 and the photoelectric conversion element 212 is similar to the connection structure between the pMOS transistor 311 and the photoelectric conversion element 211 in the monitor pixel 401.

The inverter 382 is configured to invert a signal of a cathode electric potential of the photoelectric conversion element 212, and supply the inverted signal to the multiplexer 231 (or the multiplexer 323) as a pulse signal of the imaging pixel 402.

FIG. 11 is a plan view illustrating a configuration example of a pixel array section 400 according to the first embodiment of the present technology. The pixel array section 400 includes the light receiving section 210 of the pixel chip 201 and the circuit block 300 of the circuit chip 202.

In the pixel array section 400, a plurality of the monitor pixels 401 and a plurality of the imaging pixels 402 are arrayed. The monitor pixels 401 are linearly arrayed along a boundary of the pixel array section 400. For example, the monitor pixels 401 are arrayed in a line at an upper end of the pixel array section 400. On the other hand, the imaging pixels 402 are arrayed in a two-dimensional lattice form.

FIG. 12 is a block diagram illustrating a configuration example of the monitor pixels 401, the imaging pixels 402, and the control section 500 according to the first embodiment of the present technology. The control section 500 includes an inter-pixel average acquisition section (or averaging circuit) 510, a time average acquisition section (or time averaging circuit) 520, and an electric potential control section (or potential controller) 530.

Each of the plurality of monitor pixels 401 supplies the holding potential Vs_SH to the inter-pixel average acquisition section 510. A holding potential of an m-th monitor pixel 401 is referred to as Vs_SHm (m is an integer).

The inter-pixel average acquisition section 510 is configured to calculate an average of the respective holding potentials Vs_SHm of the plurality of monitor pixels 401 as an inter-pixel average Vs_SHAVp. The inter-pixel average acquisition section 510 supplies the inter-pixel average Vs_SHAVp to the time average acquisition section 520.

The time average acquisition section 520 is configured to calculate a time average Vs_SHAVt of the inter-pixel averages Vs_SHAVp. The time average acquisition section 520 supplies the time average Vs_SHAVt to the electric potential control section 530.

The electric potential control section 530 is configured to control the anode electric potential VSPAD in a manner that the anode electric potential VSPAD becomes lower as the time average Vs_SHAVt of the held cathode electric potential gets higher. All anodes of the plurality of monitor pixels 401 and the plurality of imaging pixels 402 are connected in common to the electric potential control section 530, and the electric potential control section 530 controls electric potentials of the anodes. Note that, the electric potential control section 530 controls cathode electric potentials if the monitor pixels 401 monitor anode electric potentials.

In addition, in the monitor pixel 401, one of the anode and the cathode of the photoelectric conversion element 211 (for example, the cathode) is connected to the connection node 312. The pMOS transistor 311 supplies the power source electric potential VE to the connection node 312 in response to the control signal RCH.

The timing detection circuit 320 detects a timing at which a predetermined period of time has elapsed since the cathode electric potential Vs of the connection node 312 started to decrease from the power source electric potential VE. This timing corresponds to a timing at which a predetermined delay time has elapsed since the cathode electric potential fell below a threshold of the inverter 321.

The sample and hold circuit 330 captures and holds the cathode electric potential Vs as the holding potential Vs_SH on the basis of the timing detected by the timing detection circuit 320.

Next, the control section 500 controls the other of the anode and the cathode of the photoelectric conversion element 211 (for example, the anode) in a manner that the electric potential becomes lower as the holding potential Vs_SH gets higher.

In addition, in the monitor pixel 401, the buffer 340 is installed at a stage prior to the sample and hold circuit 330. This makes it possible to uniform capacitances of the respective connection nodes of the monitor pixels 401 and the imaging pixels 402. This connection node is the connection node between the photoelectric conversion element and the pMOS transistor. This makes it possible to uniform the respective breakdown voltages VBD of the monitor pixels 401 and the imaging pixels 402.

"Configuration Example of Control Section"

FIG. 13 is a circuit diagram illustrating a configuration example of the control section 500 according to the first embodiment of the present technology. The inter-pixel average acquisition section 510 includes a plurality of resistors 511 and a capacitor 512. The resistors 511 are provided for the respective monitor pixels 401. The time average acquisition section 520 includes a variable resistor 521 and a variable capacitor 522. The electric potential control section 530 includes an amplifier 531.

The resistor 511 in the inter-pixel average acquisition section 510 has an end connected to the corresponding monitor pixel 401, and the other end connected to an end of the capacitor 512 and the time average acquisition section 520. In other words, the plurality of resistors 511 is connected in parallel between the plurality of monitor pixels 401 and the capacitor 512. The other end of the capacitor 512 is connected to a ground electric potential. The resistors 511 make it possible to generate an average electric potential of the holding potentials Vs_SHm of the plurality of monitor pixels 401 as the inter-pixel average Vs_SHAVp, and the capacitor 512 holds the inter-pixel average Vs_SHAVp. By acquiring the inter-pixel average, it is possible to suppress bad influences caused by variation in the holding potentials Vs_SH between the pixels.

In addition, the variable resistor 521 in the time average acquisition section 520 has an end connected to the inter-pixel average acquisition section 510, and the other end connected to an end of the variable capacitor 522 and the electric potential control section 530. The other end of the variable capacitor 522 is connected to a ground electric potential. A circuit including the variable resistor 521 and the variable capacitor 522 functions as an analog low-pass filter that generates the time average Vs_SHAVt of the inter-pixel averages Vs_SHAVp. Note that, the circuit including the variable resistor 521 and the variable capacitor 522 is an example of an analog filter according to an embodiment of the present technology.

The time average Vs_SHAVt is input to an inverting input terminal (−) of the amplifier 531 in the electric potential control section 530, and a predetermined power source electric potential is input to a non-inverting input terminal (+). The amplifier 531 generates a comparison result between the time average Vs_SHAVt and the predetermined power source electric potential as the VSPAD by using the following expression, and supplies the VSPAD to the anodes of the monitor pixels 401 and the imaging pixels 402.

$$VSPAD = Av(VREF - Vs\_SHAVt)$$

In the above expression, Av represents gain of the amplifier 531, and VREF represents a target value of the VSPAD.

FIG. 14 is a diagram illustrating an example of variation in the cathode electric potential Vs and the anode electric potential VSPAD according to the first embodiment of the present technology. The pMOS transistor 311 supplies the power source electric potential VE, and then the cathode electric potential Vs becomes the power source electric potential VE. When photon enters, the cathode electric potential Vs decreases to a bottom electric potential VBT, and increases to the initial power source electric potential VE through recharge.

Here, voltage between the power source electric potential VE and the bottom electric potential VBT is referred to as excess bias VEX. In addition, voltage between the bottom electric potential VBT and the anode electric potential VSPAD is referred to as the breakdown voltage VBD. In the case where the power source electric potential VE and the anode electric potential VSPAD are constant, the excess bias VEX varies depending on temperature and variation in the breakdown voltage VBD.

In the case where the excess bias VEX becomes small, sensitivities of photodiodes in the imaging pixels 402 decreases when the photon enters. In such a case, the pulse signals of the imaging pixels 402 are not generated even when the photon enters, and photon detection efficiency (PDE) decreases. Therefore, the control section 500 reduces the anode electric potential VSPAD as the holding potential gets higher when the cathode electric potential Vs decreases. This makes it possible to increase the breakdown voltage VBD, increase the excess bias VEX, and improve the PDE.

FIGS. 15A and 15B are diagrams illustrating examples of variation in excess bias VEX and an anode electric potential VSPAD according to the first embodiment of the present technology and a comparative example. FIG. 15A is a diagram illustrating an example of variation in excess bias VEX and an anode electric potential VSPAD according to the first embodiment. FIG. 15B is a diagram illustrating an example of variation in excess bias VEX according to the comparative example in which the anode electric potential VSPAD is not controlled. In FIGS. 15A and 15B, vertical axes represent electric potentials, and horizontal axes represent temperatures. In addition, in FIGS. 15A and 15B, it is assumed that an amount of incident light is constant, and the holding potential Vs_SH is substantially the same as the bottom electric potential VBT.

The holding potential (the bottom electric potential VBT) increases as the temperature gets higher. Therefore, as illustrated in FIG. 15A, the control section 500 reduces the anode electric potential VSPAD by a value corresponding to the increase. As a result, it is possible to maintain the excess bias VEX at a constant value without depending on the variation in temperature. This makes it possible to suppress reduction in the PDE caused by the variation in temperature.

On the other hand, in the comparative example in which the anode electric potential VSPAD is not controlled as illustrated in FIG. 15B, the bottom electric potential VBT increases as the temperature gets higher, and thereby the excess bias VEX decreases. This causes reduction in the PDE.

As illustrated in FIGS. 15A and 15B, it is possible to suppress reduction in the PDE caused by the variation in temperature under the control of the control section 500. However, monitor voltage (such as the cathode electric potentials) for observing the bottom electric potential VBT follows the variation in the excess bias caused by the temperature, and the monitor voltage also varies depending on decrease or increase in an amount of incident light.

FIGS. 16A and 16B are timing diagrams illustrating variation in a cathode electric potential Vs obtained in the case of a large amount of light and variation in a cathode electric potential Vs obtained in the case of a small amount of light according to the first embodiment of the present technology. FIG. 16A is a timing diagram illustrating variation in the cathode electric potential Vs obtained in the case of a relatively small amount of light. FIG. 16B is a timing diagram illustrating variation in the cathode electric potential Vs obtained in the case of a relatively large amount of light. In FIGS. 16A and 16B, it is assumed that the temperature is constant.

In the case of the small amount of light as illustrated in FIG. 16A, recharge is done at a timing T1, and the cathode electric potential Vs becomes a power source electric potential VE. Next, when the photon enters at a timing T10, the cathode electric potential Vs starts decreasing. After a timing T12, the cathode electric potential Vs becomes constant. The electric potential obtained at the timing T12 is a bottom electric potential VBT1.

On the other hand, in the case of the large amount of light as illustrated in FIG. 16B, a cathode electric potential Vs has the same locus as FIG. 16A until the timing T12. However, after the timing T12, a leakage current increases in response to the amount of light, and the cathode electric potential Vs further decreases. Subsequently, the cathode electric potential Vs reaches a bottom electric potential VBT2 immediately before a timing T2 at which recharge will be done again. The bottom electric potential VBT2 is lower than the bottom electric potential VBT1 obtained in the case of the small amount of light.

As described above, even in the case where the temperature is constant, the bottom electric potential VBT varies because of decrease or increase in the amount of incident light. Therefore, if the control section 500 controls the anode electric potential VSPAD on the basis of the bottom electric potential VBT, this causes variation in a voltage value for suppressing variation in the excess bias caused by decrease or increase in an amount of light.

Accordingly, the timing detection circuit 320 in the monitor pixel 401 adjusts delay time and a threshold VT and detects the timing T12 in a manner that the timing T12 is a timing at which the delay time has elapsed since a timing T11. Next, the sample and hold circuit 330 captures the cathode electric potential Vs of the timing T12, and holds it as the holding potential Vs_SH. As illustrated in FIGS. 16A and 16B, the locus of the cathode electric potential Vs in FIG. 16A is the same as the locus of the cathode electric potential Vs in FIG. 16B until the timing T12 regardless of the decrease or increase in amounts of light. Therefore, it is possible to uniformly suppress variation in the excess bias caused by decrease or increase in the amount of light, when the control section 500 controls the anode electric potential VSPAD in response to the holding potential Vs_SH at any given time. This makes it possible to further improve the PDE. Note that, the time period between the timing T10 and the timing T12 is an example of a predetermined period of time according to an embodiment of the present technology.

FIGS. 17A and 17B are timing diagrams illustrating examples of fluctuations in the bottom electric potential VBT obtained in the case of the large amount of light and fluctuations in the bottom electric potential VBT obtained in the case of the small amount of light according to the first embodiment of the present technology. FIG. 17A is a timing diagram illustrating an example of fluctuations in the bottom electric potential VBT obtained in the case of the small amount of light. FIG. 17B is a timing diagram illustrating an example of fluctuations in the bottom electric potential VBT obtained in the case of the large amount of light. In addition, dash-dotted lines indicate time averages of the bottom electric potentials VBT.

FIG. 18 is a scatter plot illustrating an example of a variation range of the breakdown voltage VBD according to the first embodiment of the present technology. In FIG. 18, a vertical axis represents voltage of the breakdown voltage VBD, and a horizontal axis represents the number of pixels (the monitor pixels and the imaging pixels). In addition, each plotted dot represents breakdown voltage VBD of a single pixel, and a solid curve represents a boundary of a set of the plotted dots. As exemplified in FIG. 18, the distribution of breakdown voltage VBD is similar to a normal distribution.

FIG. 19 is a timing diagram illustrating an example of operation of the monitor pixel 401 and the control section 500 according to the first embodiment of the present technology. The monitor pixel 401 is recharged at a timing T1, and the cathode electric potential Vs becomes a power source electric potential VE. Next, when the photon enters at a timing T10, the cathode electric potential Vs starts decreasing.

When the cathode electric potential Vs falls below a threshold VT of the inverter 321 at a timing T11, an inverted signal of the inverter 321 rises, and the pulse generation circuit 370 generates a pulse signal SW at a timing T12 after delaying the inverted signal by delay time.

The sample and hold circuit 330 captures the cathode electric potential Vs within a time period of the pulse width of the pulse signal SW, and holds it as the holding potential Vs_SH.

In addition, at the timing T1, the connection node 312 shifts from a high impedance (Hi-Z) state to a low impedance (Low-Z) state through the recharge. Subsequently, the connection node 312 shifts to the high impedance state before the timing T12.

The amount of decrease in the cathode electric potential Vs after the timing T12 varies depending on an amount of light. However, at the timing T12, the sample and hold circuit 330 holds the cathode electric potential Vs. This makes it possible to maintain the holding potential Vs_SH at a constant value regardless of the amount of light. Therefore, it is possible to suppress variation in the excess bias caused by decrease or increase in the amount of light, when the control section 500 controls the anode electric potential VSPAD in response to the holding potential Vs_SH.

"Operation Example of Solid State Image Sensor"

FIG. 20 is a flowchart illustrating an example of operation of the solid state image sensor 200 according to the first embodiment of the present technology. This operation starts when a predetermined application for measuring a distance is executed, for example.

The monitor pixel 401 detects a timing at which delay time has elapsed since the cathode electric potential Vs fell below the threshold VT (Step S901). Next, the monitor pixel 401 captures and holds the cathode electric potential Vs on the basis of the timing (Step S902). The control section 500 controls the anode electric potential VSPAD in a manner that the anode electric potential VSPAD decreases as the holding potential gets higher (Step S903). After Step S903, the monitor pixel 401 repeatedly executes Step S901 and the subsequent steps.

As described above, according to the first embodiment of the present technology, the monitor pixel 401 detects a timing at which a predetermined period of time has elapsed since decrease in a cathode electric potential, and captures and holds the cathode electric potential at that timing. This makes it possible to hold the electric potential without depending on an amount of light. It is possible to suppress variation in bias voltage resulting from decrease or increase in the amount of light, when the control section 500 controls an anode electric potential in response to the holding potential.

"First Modification"

In the first embodiment described above, the monitor pixel 401 monitors the cathode electric potential Vs of the photoelectric conversion element 211, and controls the anode electric potential on the basis of the cathode electric potential Vs. However, it is also possible for the monitor pixel 401 to monitor the anode electric potential instead of the cathode electric potential. Such a monitor pixel 401 according to the first modification of the first embodiment is different from the monitor pixel 401 according to the first embodiment in that the monitor pixel 401 according to the first modification monitors the anode electric potential of the photoelectric conversion element 211 and controls the cathode electric potential on the basis of the anode electric potential.

FIG. 21 is a block diagram illustrating a configuration example of the monitor pixel 401 according to the first modification of the first embodiment of the present technology. In the monitor pixel 401 according to the first modification of the first embodiment, the anode of the photoelectric conversion element 211 is connected to the connection node 312, and the cathode is connected to the control section 500. In addition, the pMOS transistor 311 is interposed between the connection node 312 and the ground electric potential VS.

Note that, a connection structure between the photoelectric conversion element 212 and the pMOS transistor 381 in an imaging pixel 402 is similar to that of the monitor pixel 401.

The timing detection circuit 320 detects a timing at which a predetermined period of time has elapsed since the anode electric potential becomes higher than the ground electric potential VS. In this case, for example, it is only necessary for the timing detection circuit 320 to include the inverters at two stages or include a buffer instead of the inverter.

As described above, according to the first modification of the first embodiment of the present technology, the monitor pixel 401 detects a timing at which a predetermined period of time has elapsed since increase in the anode electric potential, and captures and holds the anode electric potential at that timing. This makes it possible to hold the electric potential without depending on an amount of light. It is possible to suppress variation in bias voltage resulting from decrease or increase in the amount of light, when the control section 500 controls the cathode electric potential in response to the holding potential.

"Second Modification"

In the first embodiment described above, the function of the control section 500 is implemented by the analog circuit. However, in general, the analog circuit has a larger circuit size than a digital circuit. Therefore, this may result in increase in the size of the footprint. A control section 500 according to the second modification of the first embodiment is different from the control section 500 according to the first modification in that the control section 500 according to the second modification includes a digital circuit.

FIG. 22 is a block diagram illustrating a configuration example of the control section 500 according to the second modification of the first embodiment of the present technology. In the control section 500 according to the second modification of the first embodiment, the inter-pixel average acquisition section 510 includes an analog-to-digital conversion section 513 and an averaging filter 515. In addition, the time average acquisition section 520 includes a digital low-pass filter 524. The electric potential control section 530 includes a power integrated circuit (IC) 533.

The analog-to-digital conversion section 513 is configured to convert respective holding potentials of the plurality of monitor pixels 401 into digital signals. The analog-to-digital conversion section 513 includes a plurality of analog-to-digital converters (ADC) 514. The ADCs 514 are provided for the respective monitor pixels 401. The ADC 514 converts the holding potential Vs_SHm of the corresponding monitor pixel 401 into a digital signal, and supplies the digital signal to the averaging filter 515.

The averaging filter 515 is a digital filter for calculating an average value of the respective digital signals of the plurality of monitor pixels 401 as an inter-pixel average Vs_SHAVp.

The digital low-pass filter 524 is a digital filter that passes low-frequency components. The low-frequency components are lower than a predetermined cutoff frequency. This makes it possible to obtain a time average Vs_SHAVt of the inter-pixel averages Vs_SHAVp.

The power IC 533 is configured to control the anode electric potential VSPAD in a manner that the anode electric potential VSPAD becomes lower as the time average Vs_SHAVt gets higher. Note that, the power IC 533 is an example of a power semiconductor according to an embodiment of the present technology.

As illustrated in FIG. 22, it is possible to reduce the size of the footprint of the control section 500 when the function of the control section 500 is implemented by the digital circuit.

As described above, according to the second modification of the first embodiment of the present technology, the control section 500 includes the digital circuit. This makes it possible to reduce the size of the footprint in comparison with the case of the analog circuit.

"Third Modification"

In the second modification of the first embodiment described above, the inter-pixel average acquisition section 510 includes the ADCs 514 corresponding to the respective monitor pixels 401. However, in this case, the number of the ADCs 514 increases as the number of monitor pixels 401 gets larger. An inter-pixel average acquisition section 510 according to the third modification of the first embodiment is different from the inter-pixel average acquisition section 510 according to the second modification of the first embodiment in that a plurality of monitor pixels 401 according to the third modification shares a single ADC 514.

Figure 23:
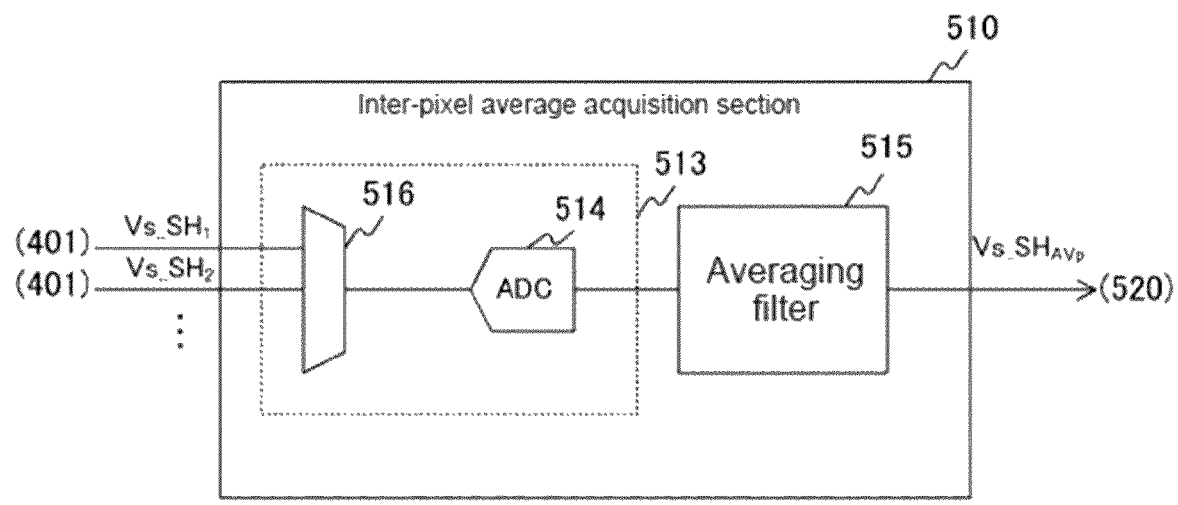
FIG. 23 is a block diagram illustrating a configuration example of an inter-pixel average acquisition section according to a third modification of the first embodiment of the present technology.

FIG. 23 is a block diagram illustrating a configuration example of the inter-pixel average acquisition section 510 according to the third modification of the first embodiment of the present technology. The inter-pixel average acquisition section 510 according to the third modification of the first embodiment is different from the inter-pixel average acquisition section 510 according to the second modification of the first embodiment in that an analog-to-digital conversion section 513 according to the third modification includes a single selector 516 and the single ADC 514.

The selector 516 is configured to sequentially select any of the respective holding potentials Vs_SHm of the plurality of monitor pixels 401. The selector 516 supplies the selected holding potential to the ADC 514. Each time a holding potential is selected, the ADC 514 converts the holding potential into a digital signal and supplies the digital signal to the averaging filter 515.

As exemplified in FIG. 23, it is possible for the plurality of monitor pixels 401 to share the single ADC 514 because the selector 516 is installed. This makes it possible to reduce the circuit size in comparison with the case where the ADCs 514 are provided for the respective monitor pixels 401.

As described above, according to the third modification of the first embodiment of the present technology, the selector 516 is installed for selecting any of the respective holding potentials Vs_SHm of the plurality of monitor pixels 401. This allows the plurality of monitor pixels 401 to share the single ADC 514.

"Fourth Modification"

In the first embodiment described above, a function of the control section 500 is implemented by the analog circuit. However, in general, the analog circuit has a larger circuit size than a digital circuit. Therefore, this may result in increase in the size of the footprint. A control section 500 according to the fourth modification of the first embodiment is different from the control section 500 according to the first modification in that the control section 500 according to the fourth modification includes digital circuits.

Figure 24:
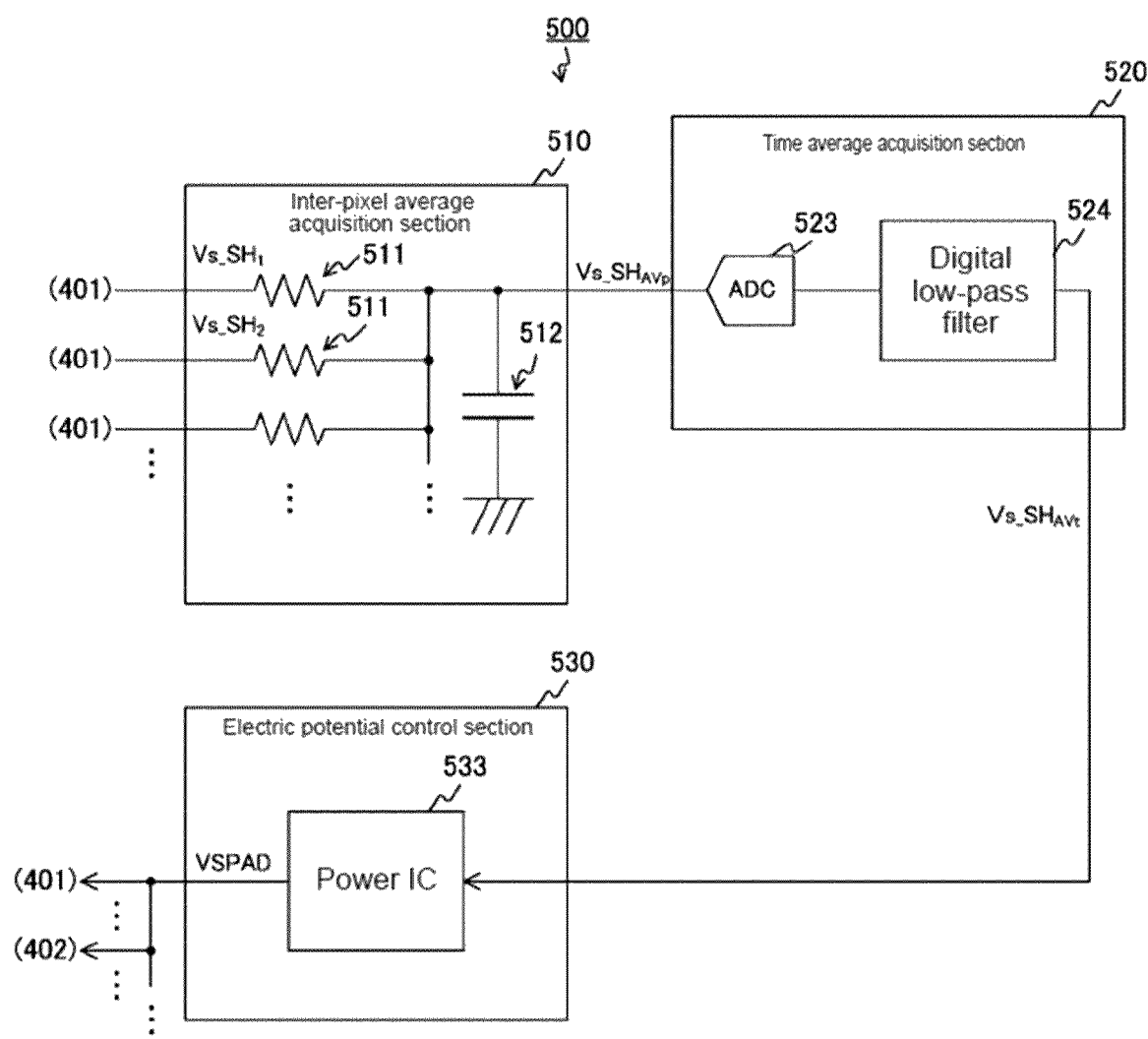
FIG. 24 is a block diagram illustrating a configuration example of a control section according to a fourth modification of the first embodiment of the present technology.

FIG. 24 is a block diagram illustrating a configuration example of the control section 500 according to the fourth modification of the first embodiment of the present technology. In the control section 500 according to the fourth modification of the first embodiment, the time average acquisition section 520 includes an ADC 523 and the digital low-pass filter 524, and the electric potential control section 530 includes the power IC 533. In addition, the circuit configuration of the inter-pixel average acquisition section 510 according to the fourth modification of the first embodiment is similar to that of the first embodiment.

The ADC 523 is configured to convert an analog inter-pixel average Vs_SHAVp into a digital signal, and supply the digital signal to the digital low-pass filter 524.

As described above, according to the fourth modification of the first embodiment of the present technology, the time average acquisition section 520 and the electric potential control section 530 includes digital circuits. This makes it possible to reduce the size of the footprint in comparison with the case of the analog circuit.

"Fifth Modification"

In the first embodiment described above, the function of the control section 500 is implemented by the analog circuit. However, in general, the analog circuit has a larger circuit size than a digital circuit. Therefore, this may result in increase in the size of the footprint. A control section 500 according to the fifth modification of the first embodiment is different from the control section 500 according to the first modification in that the control section 500 according to the fifth modification includes a digital circuit.

Figure 25:
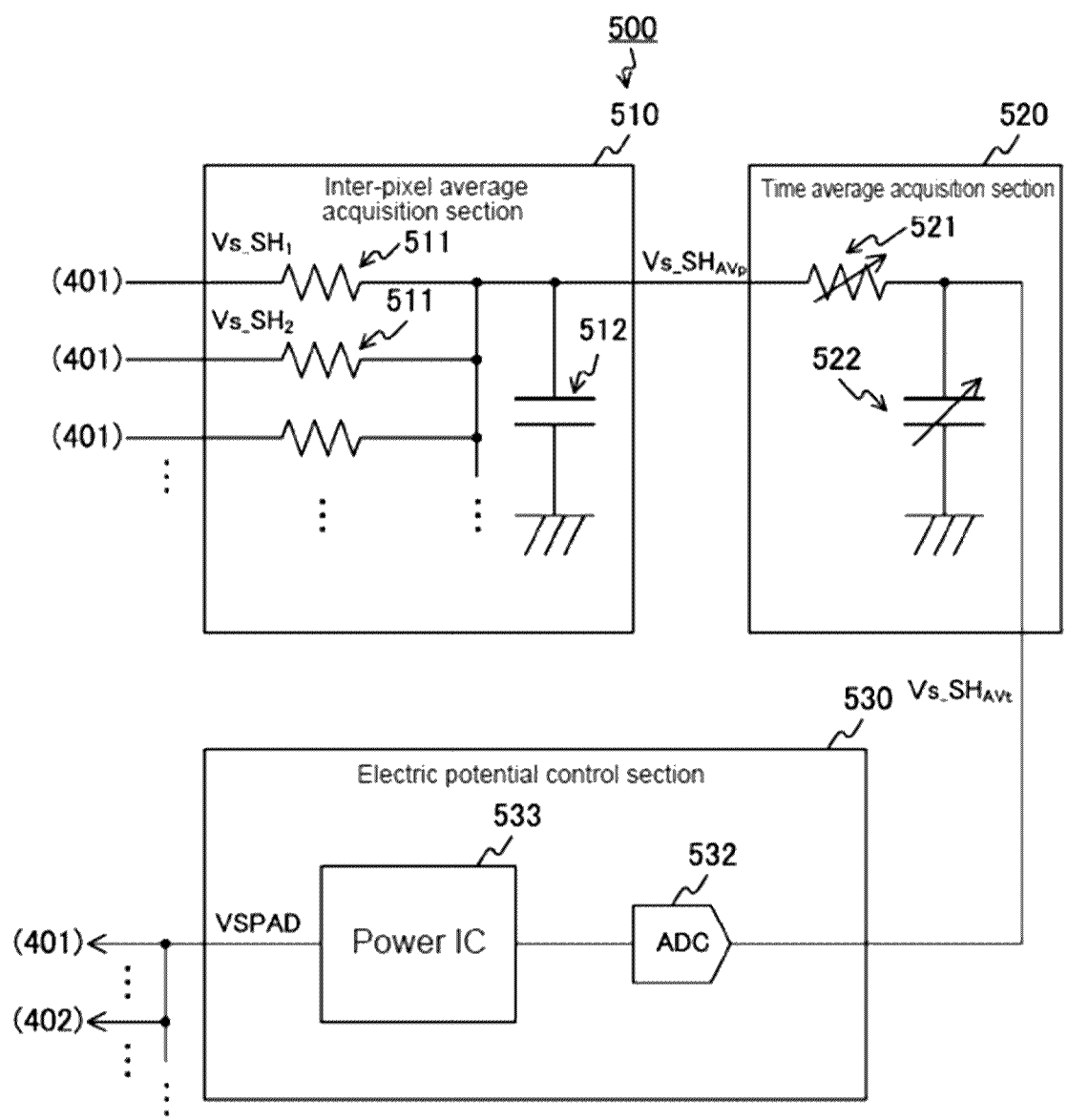
FIG. 25 is a block diagram illustrating a configuration example of a control section according to a fifth modification of the first embodiment of the present technology.

FIG. 25 is a block diagram illustrating a configuration example of the control section 500 according to the fifth modification of the first embodiment of the present technology. In the control section 500 according to the fifth modification of the first embodiment, the electric potential control section 530 includes an ADC 532 and the power IC 533. In addition, the circuit configurations of the inter-pixel average acquisition section 510 and the time average acquisition section 520 according to the fifth modification of the first embodiment are similar to those of the first embodiment.

The ADC 532 is configured to convert an analog time average Vs_SHAVt into a digital signal, and supply the digital signal to the power IC 533.

As described above, according to the fifth modification of the first embodiment of the present technology, the electric potential control section 530 includes the digital circuit. This makes it possible to reduce the size of the footprint in comparison with the case of the analog circuit.

"Sixth Modification"

In the first embodiment described above, the buffers 340 and 350 output single-ended signals. However, if the number of monitor pixels 401 increases and therefore signal lines that transmit the single-ended signals have longer wire lengths, wiring resistance increases. This may result in shortage of driving forces of the buffers 340 and 350. Buffers 340 and 350 according to the sixth modification of the first embodiment are different from the buffers 340 and 350 according to the first embodiment in that the buffers 340 and 350 according to the sixth modification output differential signals.

Figure 26:
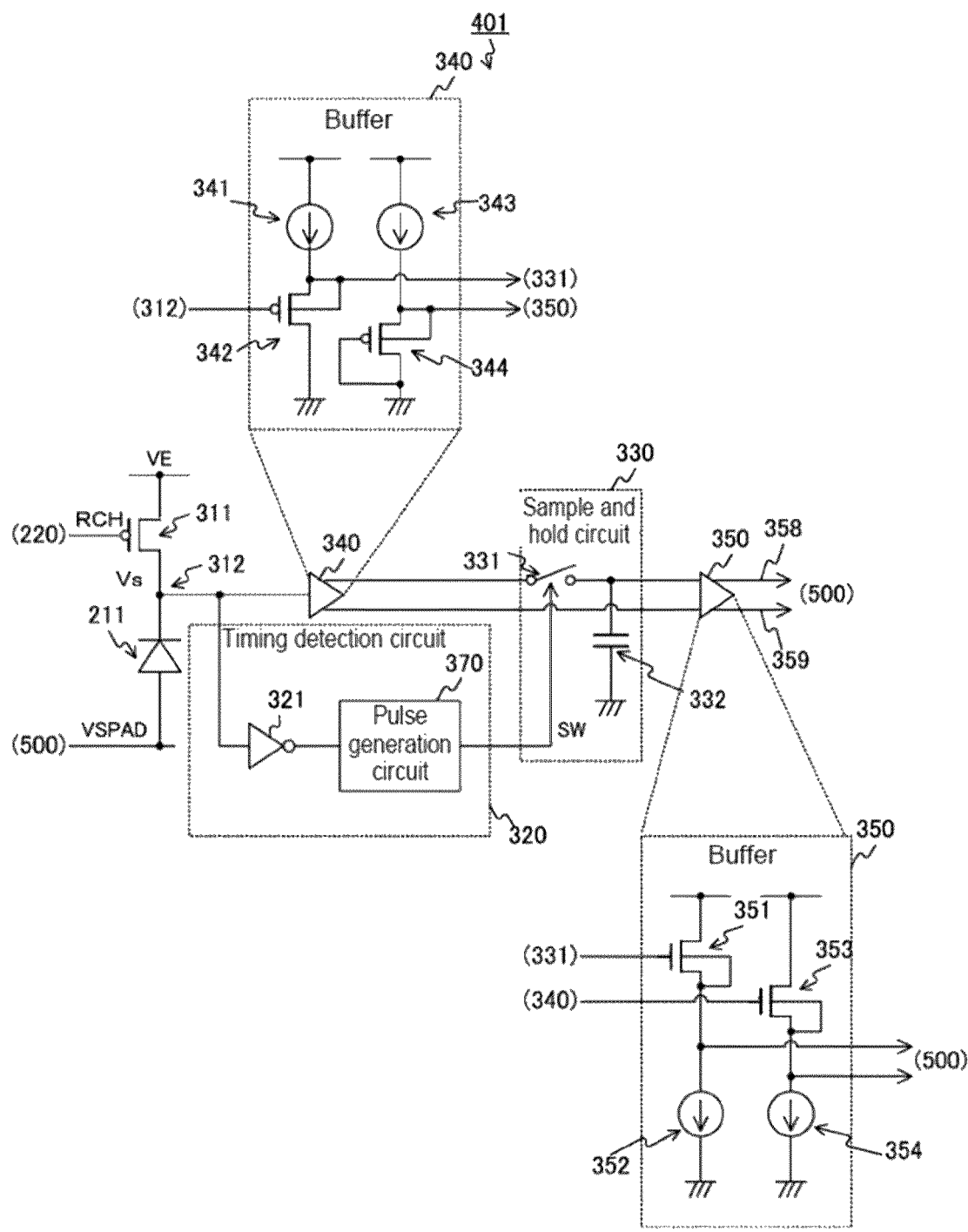
FIG. 26 is a circuit diagram illustrating a configuration example of a monitor pixel according to a sixth modification of the first embodiment of the present technology.

FIG. 26 is a circuit diagram illustrating a configuration example of a monitor pixel 401 according to the sixth modification of the first embodiment of the present technology. In the monitor pixel 401 according to the sixth modification of the first embodiment, the buffer 340 includes electric current sources 341 and 343 and pMOS transistors 342 and 344. In addition, the buffer 350 includes electric current sources 352 and 354 and nMOS transistors 351 and 353.

In the buffer 340, the electric current source 341 and the pMOS transistor 342 are connected in series between a power source electric potential and a ground electric potential. The electric current source 341 is connected to the power source side, and a gate of the pMOS transistor 342 is connected to the connection node 312. In addition, a connection node between the electric current source 341 and the pMOS transistor 342 is connected to the sample switch 331.

The electric current source 343 and the pMOS transistor 344 are connected in series between a power source electric potential and a ground electric potential. The electric current source 343 is connected to the power source side, and a gate of the pMOS transistor 344 is connected to the ground electric potential. In addition, a connection node between the electric current source 343 and the pMOS transistor 344 is connected to the buffer 350.

In the buffer 350, the nMOS transistor 351 and the electric current source 352 are connected in series between a power source electric potential and a ground electric potential. The electric current source 352 is connected to the ground side, and a gate of the nMOS transistor 351 is connected to the sample switch 331. In addition, a connection node between the nMOS transistor 351 and the electric current source 352 is connected to the control section 500 via a signal line 358.

The nMOS transistor 353 and the electric current source 354 are connected in series between a power source electric potential and a ground electric potential. The electric current source 354 is connected to the ground side, and a gate of the nMOS transistor 353 is connected to the buffer 340. In addition, a connection node between the nMOS transistor 353 and the electric current source 354 is connected to the control section 500 via a signal line 359.

The connection structure exemplified in FIG. 26 allows the buffer 340 to generate a differential signal on the basis of a cathode electric potential Vs and output the generated differential signals, and allows the buffer 350 to generate a differential signal on the basis of a holding potential Vs_SH and output the generated differential signal.

Figure 27:
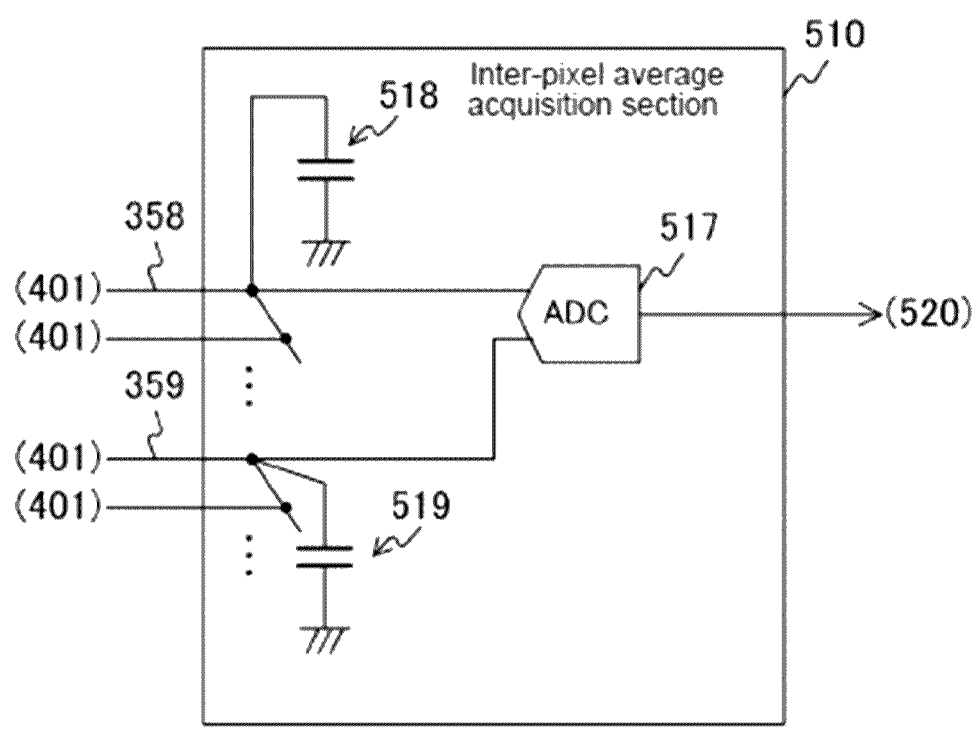
FIG. 27 is a circuit diagram illustrating a configuration example of an inter-pixel average acquisition section according to the sixth modification of the first embodiment of the present technology.

FIG. 27 is a circuit diagram illustrating a configuration example of an inter-pixel average acquisition section 510 according to the sixth modification of the first embodiment of the present technology. The inter-pixel average acquisition section 510 according to the sixth modification of the first embodiment includes capacitors 518 and 519 and an ADC 517.

Positive sides of respective differential signals of the plurality of monitor pixels 401 are connected in common to the capacitor 518 and a positive-side input terminal of the ADC 517. In addition, negative sides of the respective differential signals of the plurality of monitor pixels 401 are connected in common to the capacitor 519 and the positive-side input terminal of the ADC 517. The ADC 517 converts the differential signals into digital signals, and outputs the digital signals to the time average acquisition section 520.

As described above, in the sixth modification of the first embodiment of the present technology, the buffers 340 and 350 output differential signals. This makes it possible to obtain more accurate output values than the case of outputting single-ended signals.

2. Second Embodiment

In the first embodiment described above, the monitor pixel 401 includes the buffers (340 and 350) at two stages. However, such a monitor pixel consumes more electric power and more response time is necessary than the case of including a buffer at a single stage. Here, the response time means time from when photon enters until when a cathode electric potential is held. A monitor pixel 401 according to the second embodiment is different from the monitor pixel

401 according to the first embodiment in that a buffer is omitted from the monitor pixel 401 according to the second embodiment.

Figure 28:
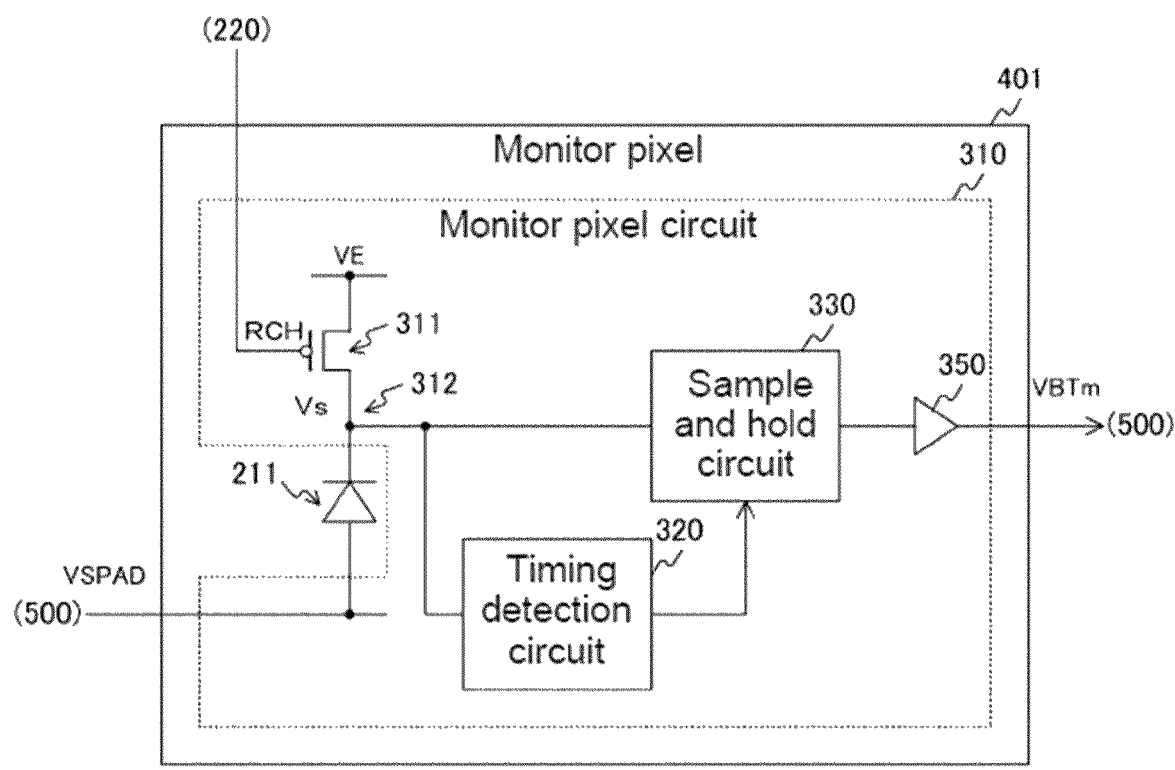
FIG. 28 is a block diagram illustrating a configuration example of a monitor pixel according to a second embodiment of the present technology.

FIG. 28 is a block diagram illustrating a configuration example of the monitor pixel 401 according to the second embodiment of the present technology. The monitor pixel 401 according to the second embodiment is different from the monitor pixel 401 according to the first embodiment in that the monitor pixel 401 according to the second embodiment does not include the buffer 340.

Figure 29:
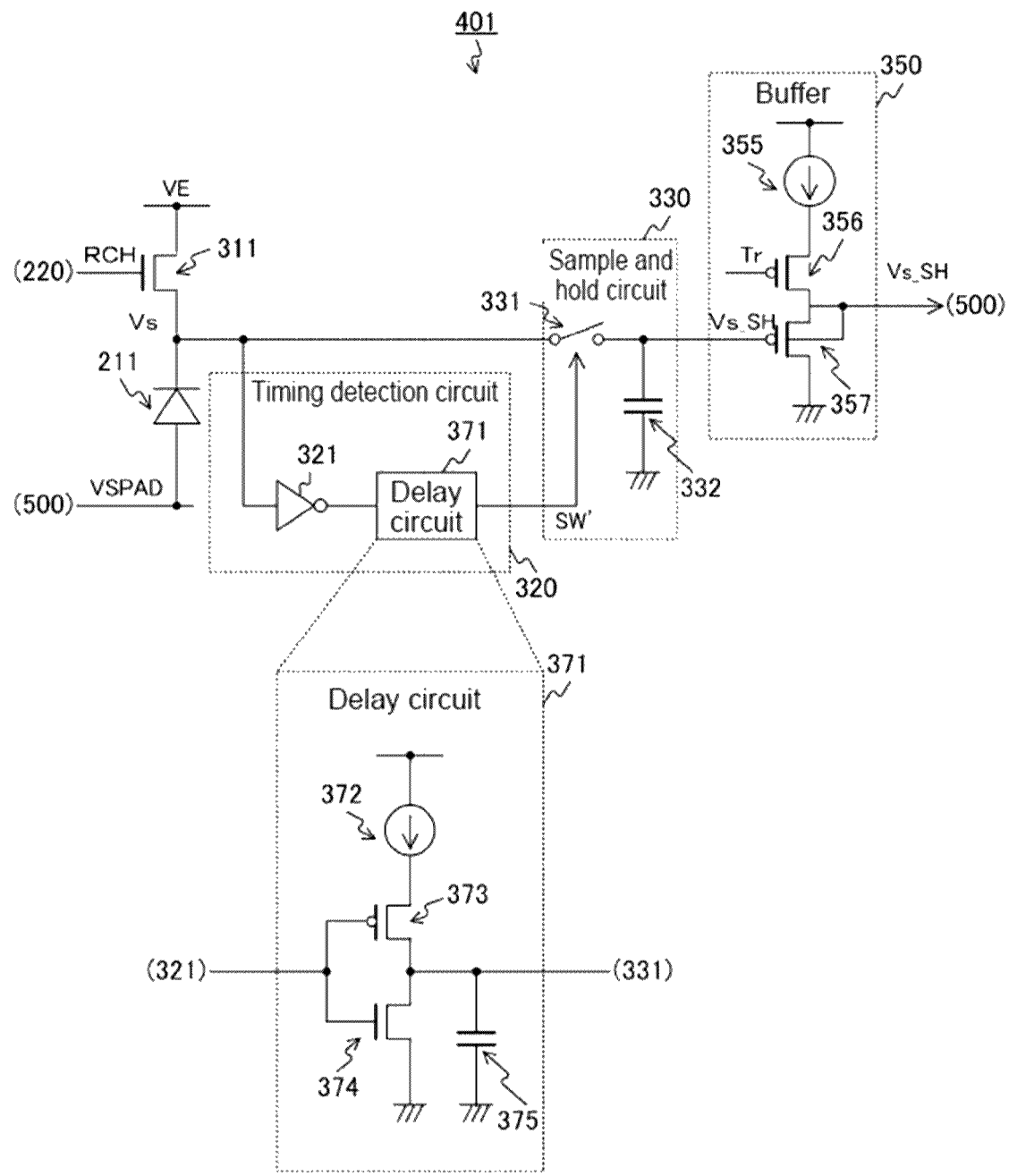
FIG. 29 is a circuit diagram illustrating the configuration example of the monitor pixel according to the second embodiment of the present technology.

FIG. 29 is a circuit diagram illustrating the configuration example of the monitor pixel 401 according to the second embodiment of the present technology. In the monitor pixel 401 according to the second embodiment, the timing detection circuit 320 includes the delay circuit 371 instead of the pulse generation circuit 370. In addition, the buffer 350 includes an electric current source 355 and pMOS transistors 356 and 357.

The circuit configuration of the delay circuit 371 according to the second embodiment is similar to that of the first embodiment. The delay circuit 371 delays an inverted signal from the inverter 321 by predetermined delay time, and supplies a delayed signal SW' to the sample switch 331.

The sample and hold circuit 330 captures the cathode electric potential Vs in the case where the delayed signal SW' is at a high level, and holds the captured electric potential in the case where the delayed signal SW' is at a low level.

In addition, in the buffer 350, the electric current source 355 and the pMOS transistors 356 and 357 are connected in series between a power source electric potential and a ground electric potential. A trigger signal Tr is input to a gate of the pMOS transistor 356, and the holding potential Vs_SH of the sample and hold circuit 330 is input to a gate of the pMOS transistor 357. The trigger signal Tr is the same signal as the delayed signal SW'. The pMOS transistor 357 is turned off when the sample and hold circuit 330 is turned on, and the pMOS transistor 357 is turned on when the sample and hold circuit 330 is turned off. In addition, a connection node between the pMOS transistors 356 and 357 is connected to the control section 500.

As exemplified in FIG. 29, the buffer 340 is omitted. Therefore, it is possible to reduce power consumption by an amount of power to be consumed by the buffer 340, and it is possible to shorten the response time by an amount of time to be consumed by the buffer 340. In addition, it is possible to design a wider voltage range for the cathode electric potential Vs than the case where the buffers are provided at two stages. This makes it possible to widen a dynamic range by the widened voltage range.

Figure 30:
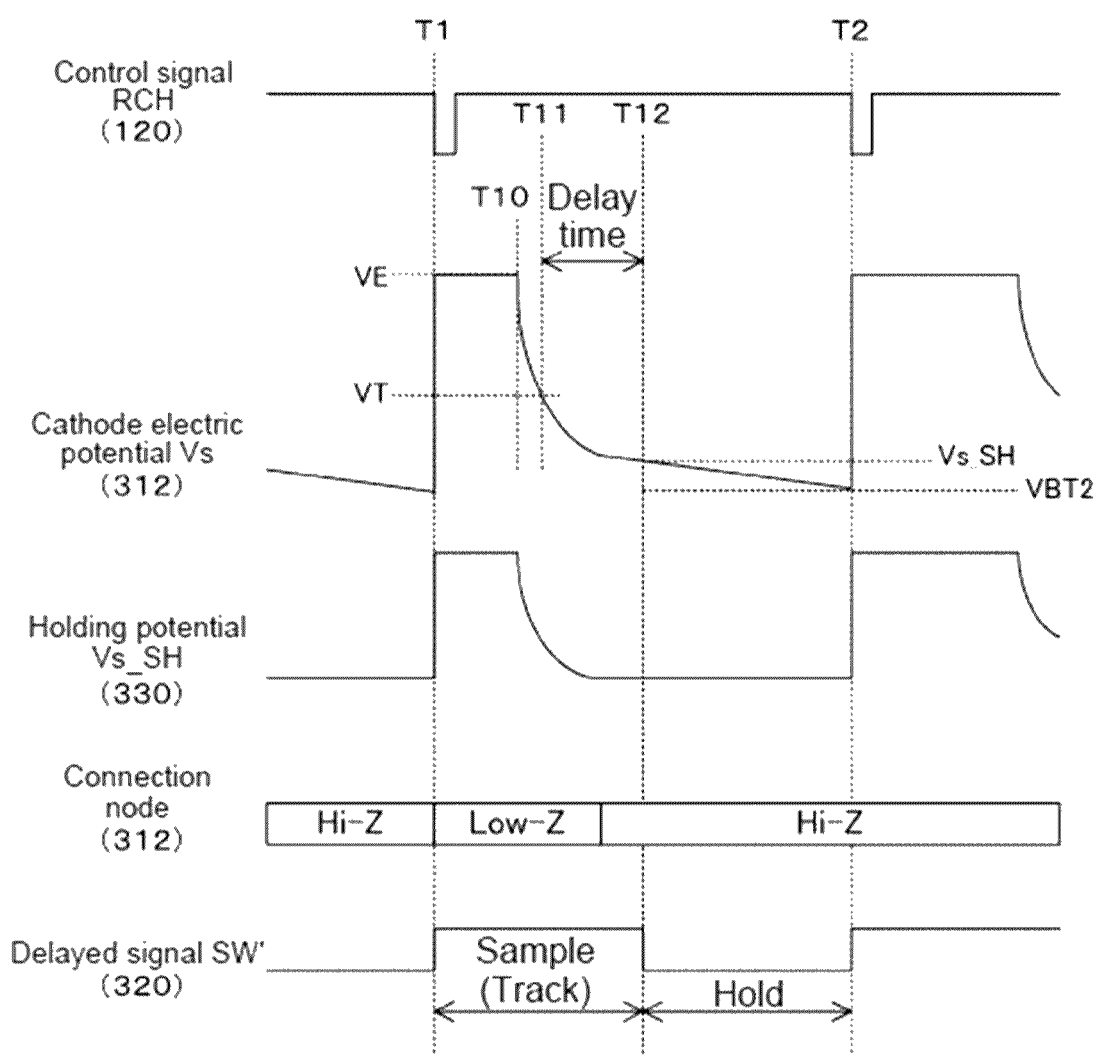
FIG. 30 is a timing diagram illustrating an example of operation of the monitor pixel and a control section according to the second embodiment of the present technology.

FIG. 30 is a timing diagram illustrating an example of operation of the monitor pixel 401 and the control section 500 according to the second embodiment of the present technology.

Within a time period from a timing T1 immediately after recharge to a timing T12 at which delay time has elapsed, the timing detection circuit 320 delays an inverted signal and outputs a high-level delayed signal SW'. In addition, within a time period from the timing T12 to a timing T2 of next recharge, the timing detection circuit 320 delays the inverted signal and outputs a low-level delayed signal SW'.

The sample and hold circuit 330 samples the cathode electric potential Vs in the case of the high-level delayed signal SW'. During this high-level period, the cathode electric potential Vs decreases, and this variation in the cathode electric potential Vs is tracked. On the other hand, the sample and hold circuit 330 holds the cathode electric potential Vs in the case of the low-level delayed signal SW'. The delayed signal SW' falls at the timing T12. Therefore, the electric potential at the timing T12 is held in a way similar to the first embodiment.

Note that, the first to fifth modifications of the first embodiment are applicable to the second embodiment.

As described above, in the second embodiment of the present technology, the buffer 340 is omitted. Therefore, it is possible to reduce power consumption and shorten the response time in comparison with the case where the buffers are provided at two stages.

"Modification"

In the second embodiment described above, the buffer 350 outputs a single-ended signal. However, if the number of monitor pixels 401 increases and therefore signal lines that transmit the single-ended signals have longer wire lengths, wiring resistance increases. This may result in shortage of a driving force of the buffer 350. A buffer 350 according to the modification of the second embodiment is different from of the buffer 350 according to the first embodiment in that the buffer 350 according to this modification outputs a differential signal.

Figure 31:
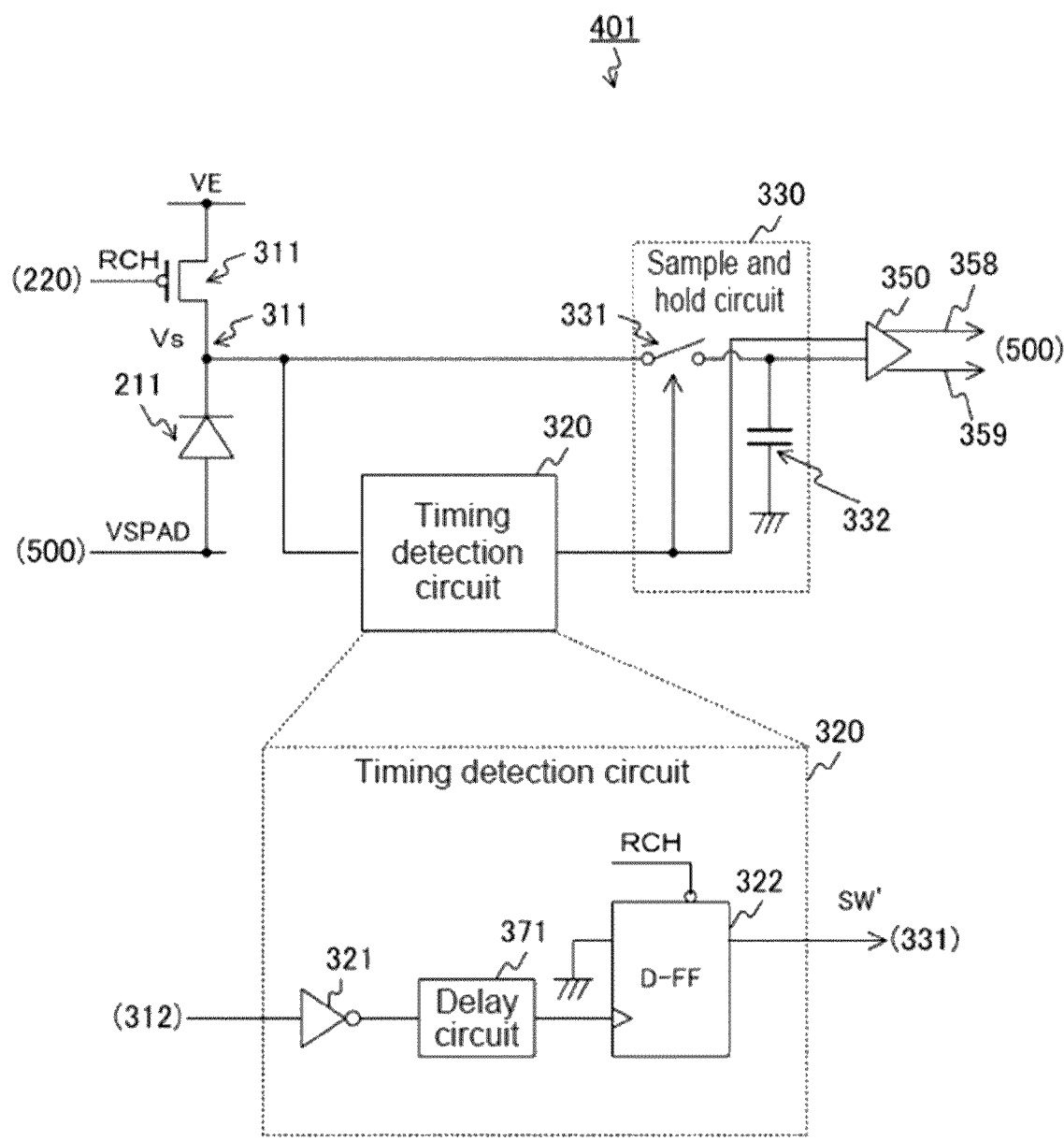
FIG. 31 is a circuit diagram illustrating a configuration example of a monitor pixel according to a modification of the second embodiment of the present technology.

FIG. 31 is a circuit diagram illustrating a configuration example of a monitor pixel 401 according to the modification of the second embodiment of the present technology. In the monitor pixel 401 according to the modification of the second embodiment, the timing detection circuit 320 further includes a D flip-flop 322.

A delayed signal from the delay circuit 371 is input to a clock terminal of the flip-flop 322. In addition, an inverted signal of the control signal RCH is input to a set terminal of the flip-flop 322, and a low level is input to a reset terminal. An output terminal of the flip-flop 322 is connected to the sample switch 331 and the buffer 350.

Figure 32:
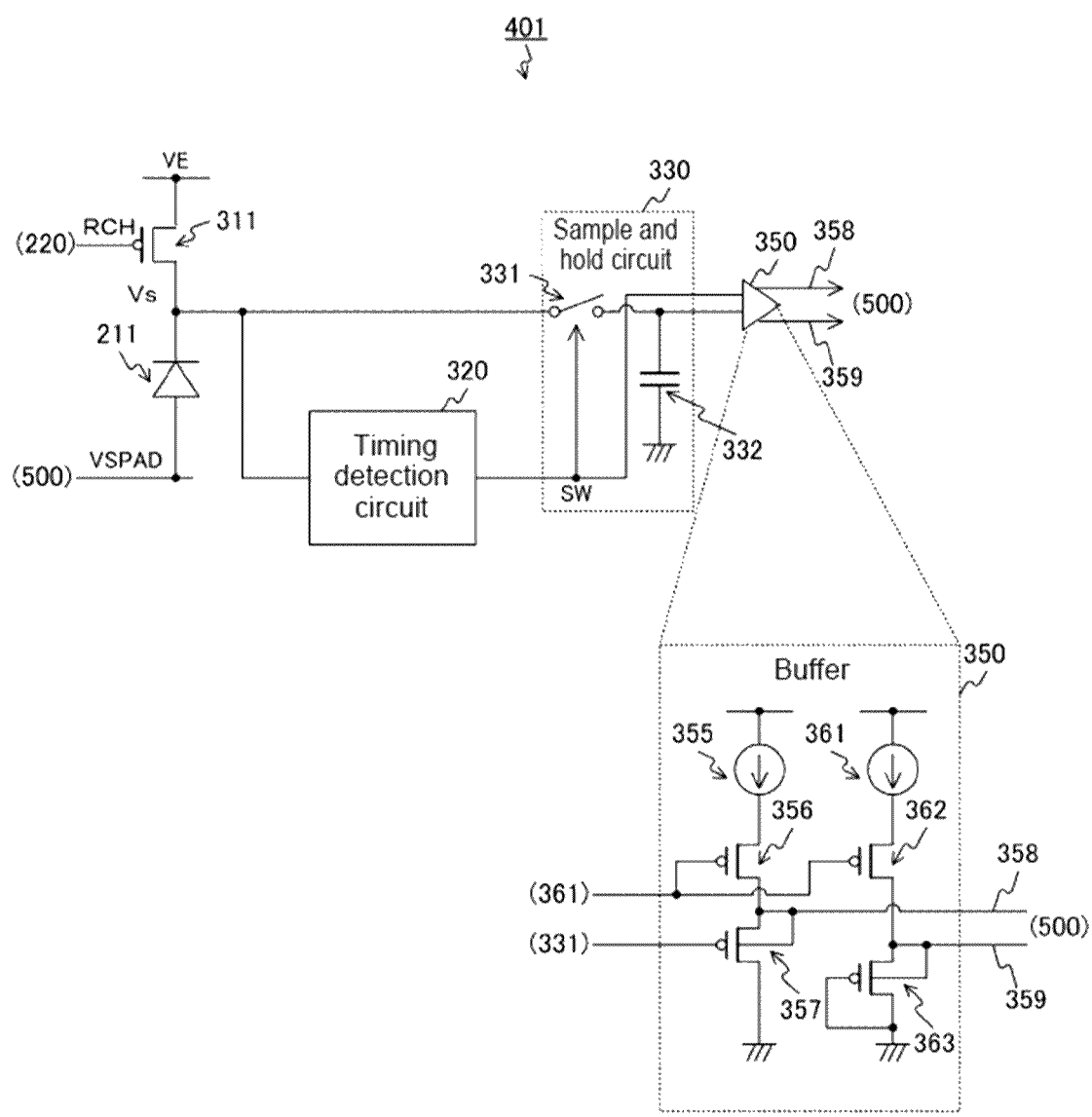
FIG. 32 is a circuit diagram illustrating a configuration example of a buffer according to the modification of the second embodiment of the present technology.

FIG. 32 is a circuit diagram illustrating a configuration example of the buffer 350 according to the modification of the second embodiment of the present technology. The buffer 350 according to the modification of the second embodiment is different from the buffer 350 according to the second embodiment in that the buffer 350 according to this modification further includes an electric current source 361 and pMOS transistors 362 and 363.

The electric current source 361 and the pMOS transistors 362 and 363 are connected in series between a power source electric potential and a ground electric potential. In addition, gates of the pMOS transistors 356 and 362 are connected in common to the timing detection circuit 320. In addition, a gate of the pMOS transistor 357 is connected to the sample switch 331, and a gate of the pMOS transistor 363 is connected to the ground electric potential.

A connection node between the pMOS transistors 356 and 357 and a connection node between the pMOS transistors 362 and 363 are connected to the control section 500 via the signal lines 358 and 359.

The configuration exemplified in FIG. 32 allows the buffer 350 to generate a differential signal on the basis of the holding potential Vs_SH and output the generated differential signal to the control section 500.

As described above, according to the modification of the second embodiment of the present technology, the buffer 350 outputs the differential signal. This makes it possible to obtain a more accurate output value than the case of outputting a single-ended signal.

3. Application Examples to Mobile Object

The technology according to an embodiment of the present disclosure (the present technology) can be applied to various products. For example, the technology according to an embodiment of the present disclosure may be realized as an apparatus mounted on any kind of mobile object such as vehicle, electric vehicle, hybrid vehicle, motorcycle, bicycle, personal mobility, airplane, drone, ship, or robot.

Figure 33:
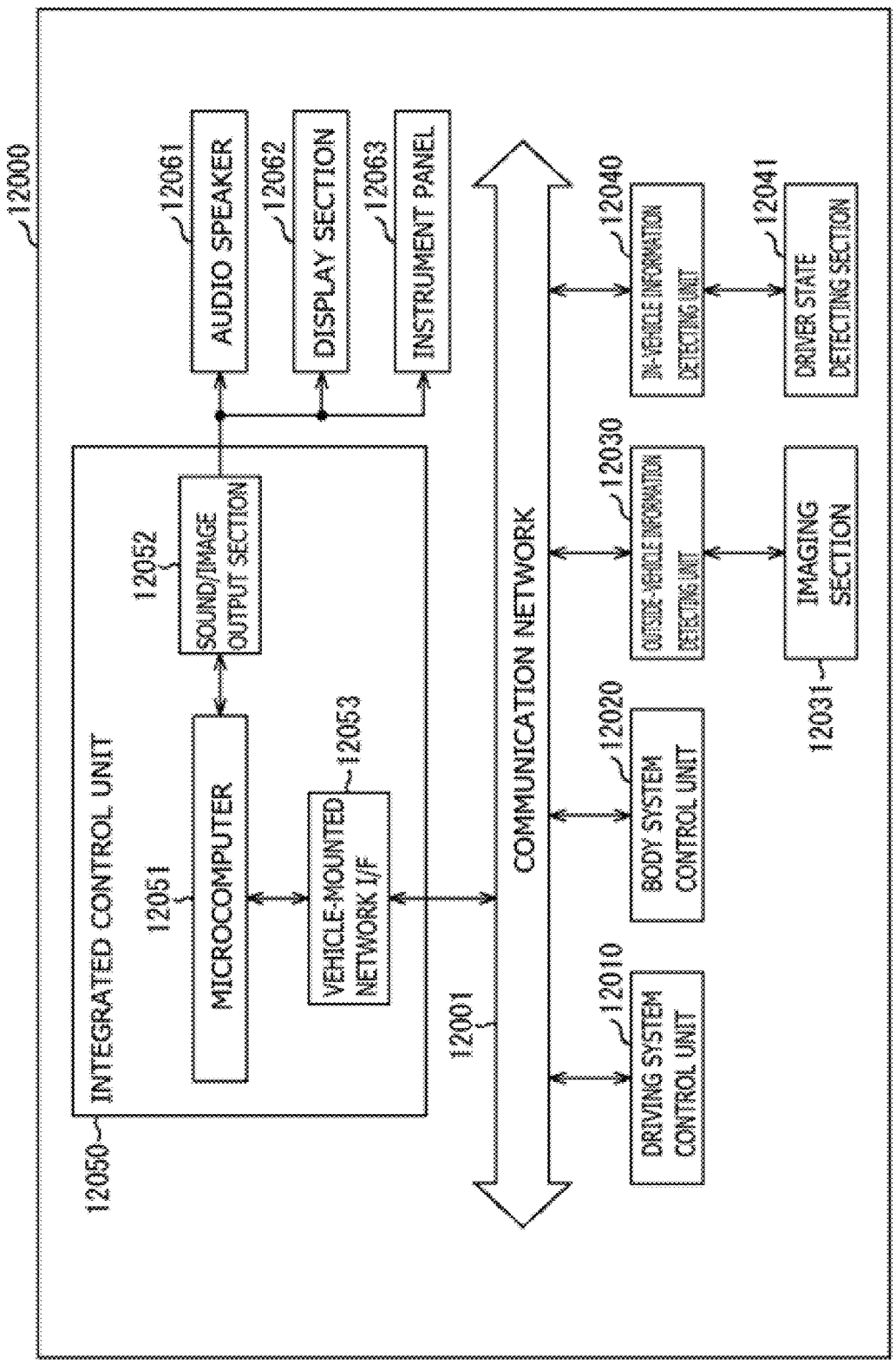
FIG. 33 is a block diagram depicting an example of schematic configuration of a vehicle control system.

FIG. 33 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 33, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent (or alternatively, reduce) glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 33, an audio speaker 12061, a display section 12062, and an instrument panel 12063 are illustrated as the output device. The display section 12062 may, for example, include at least one of an on-board display and a head-up display.

FIG. 34 is a diagram depicting an example of the installation position of the imaging section 12031.

In FIG. 34, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 34 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to an embodiment of the present disclosure can be applied, has been described above. The technology according to an embodiment of the present disclosure can be applied to the outside-vehicle information detecting unit 12030 from among the configuration described above. Specifically, it is possible to apply the ranging module 100 of FIG. 1 to the outside-vehicle information detecting unit 12030. The application of the technology according to an embodiment of the present disclosure to the outside-vehicle information detecting unit 12030 makes it possible to suppress variation in the excess bias caused by decrease or increase in the amount of light and to acquire accurate distance information.

Note that the embodiments described above are merely examples for embodying the present technology, and matters in the embodiments have a correspondence relationship with respective technology specifying matters in the claims. Likewise, technology specifying matters in the claims have a correspondence relationship with respective matters in the embodiments of the present technology that are given names identical to those of the technology specifying matters in the claims. However, the present technology is not limited to the embodiments, and may be embodied by making various modifications to the embodiments without departing from the gist of the present technology.

Note that, the effects described in the present specification are merely illustrative, and the present technology is not limited thereto. In addition, there may be other effects.

Note that, the present technology may also be configured as below.

(1)

A solid state image sensor including:

a photoelectric conversion element that includes an anode and a cathode, one of the anode and the cathode being connected to a predetermined node;

an electric potential supply element configured to supply a first electric potential to the predetermined node;

a timing detection circuit configured to detect a timing at which a predetermined period of time has elapsed since start of an increase or a decrease in an electric potential of the predetermined node from the first electric potential;

a sample and hold circuit configured to capture the electric potential of the predetermined node on the basis of output from the timing detection circuit and hold the electric potential as a second electric potential; and a control section configured to control an electric potential of another of the anode and the cathode on the basis of the second electric potential.

(2)

The solid state image sensor according to (1), in which the timing detection circuit includes an inverter configured to invert a signal of the electric potential of the predetermined node and output the inverted signal.

(3)

The solid state image sensor according to one or more of (1) to (2), in which the timing detection circuit further includes a pulse signal generation circuit configured to generate a pulse signal on the basis of a signal obtained by delaying the inverted signal by predetermined delay time, and the sample and hold circuit captures the electric potential of the predetermined node within a time period of a pulse width of the pulse signal.

(4)

The solid state image sensor according to one or more of (1) to (3), in which the timing detection circuit further includes a delay circuit configured to delay the inverted signal by predetermined delay time and output a delayed signal, and the sample and hold circuit captures the electric potential of the predetermined node in the case where the delayed signal is one of two values that are different from each other, and holds the captured electric potential in the case where the delayed signal is another of the two values.

(5)

The solid state image sensor according to one or more of (1) to (4), in which the photoelectric conversion element, the timing detection circuit, and the sample and hold circuit are installed in a pixel, the installation being performed with respect to a plurality of the pixels, and the control section includes an inter-pixel average acquisition section configured to calculate, as an inter-pixel average, an average of the respective second electric potentials of the plurality of the pixels, and a time average acquisition section configured to calculate a time average of the inter-pixel average, and an electric potential control section configured to control the electric potential of the other of the anode and the cathode in a manner that the electric potential becomes lower as the time average gets higher.

(6)

The solid state image sensor according to one or more of (1) to (5), in which the time average acquisition section includes an analog filter configured to generate the time average.

(7)

The solid state image sensor according to one or more of (1) to (6), in which the time average acquisition section includes a digital filter configured to generate the time average.

(8)

The solid state image sensor according to one or more of (1) to (7), in which the electric potential control section includes an amplifier configured to compare the time average with a predetermined power source electric potential, and output a result of the comparison to the other of the anode and the cathode.

(9)

The solid state image sensor according to one or more of (1) to (8), in which the electric potential control section includes a power semiconductor configured to control the electric potential of the other of the anode and the cathode in a manner that the electric potential becomes lower as the time average gets higher.

(10)

The solid state image sensor according to one or more of (1) to (9), in which the inter-pixel average acquisition section includes a capacitor, and a plurality of resistors connected in parallel between the plurality of the pixels and the capacitor.

(11)

The solid state image sensor according to one or more of (1) to (10), in which the inter-pixel average acquisition section includes an analog-to-digital conversion section configured to convert the second electric potentials into digital signals, and an averaging filter configured to calculate an average of the digital signals as the inter-pixel average.

(12)

The solid state image sensor according to one or more of (1) to (11), in which the analog-to-digital conversion section includes a plurality of analog-to-digital converters configured to convert the second electric potentials of the pixels that are different from each other into the digital signals.

(13)

The solid state image sensor according to one or more of (1) to (12), in which the analog-to-digital conversion section includes a selector configured to select any of the respective second electric potentials of the plurality of the pixels, and an analog-to-digital converter configured to convert the selected second electric potential into the digital signal.

(14)

The solid state image sensor according to one or more of (1) to (13), further including an output-side buffer interposed between the sample and hold circuit and the control section.

(15)

The solid state image sensor according to one or more of (1) to (14), in which the output-side buffer generates a differential signal on the basis of the second electric potential, and outputs the generated differential signal.

(16)

The solid state image sensor according to one or more of (1) to (15), further including an input-side buffer interposed between the predetermined node and the sample and hold circuit.

(17)

The solid state image sensor according to one or more of (1) to (16), in which the input-side buffer generates a differential signal on the basis of the second electric potential, and outputs the generated differential signal.

(18)
The solid state image sensor according to one or more of (1) to (17), in which
the photoelectric conversion element and the electric potential supply element are installed in each of an imaging pixel circuit and a monitor pixel circuit around the imaging pixel circuit, and
the timing detection circuit and the sample and hold circuit are installed in the monitor pixel circuit.

(19)
The solid state image sensor according to one or more of (1) to (18), in which
the cathode is connected to the predetermined node, and
the control section controls an electric potential of the anode.

(20)
The solid state image sensor according to one or more of (1) to (19), in which the anode is connected to the predetermined node, and
the control section controls an electric potential of the cathode.

(21)
A ranging system including:
a light emission section configured to supply irradiation light; and
a solid state image sensor that includes a photoelectric conversion element including an anode and a cathode, one of the anode and the cathode being connected to a predetermined node, an electric potential supply element configured to supply a first electric potential to the predetermined node, a timing detection circuit configured to detect a timing at which a predetermined period of time has elapsed since start of an increase or a decrease in an electric potential of the predetermined node from the first electric potential, a sample and hold circuit configured to capture the electric potential of the predetermined node on the basis of output from the timing detection circuit and hold the electric potential as a second electric potential, a control section configured to control an electric potential of another of the anode and the cathode on the basis of the second electric potential, and a ranging section configured to measure a distance on the basis of a round-trip time between a light emission timing of the irradiation light and a light reception timing of reflected light corresponding to the irradiation light.

(22)
A light detecting device, comprising:
first pixel circuitry including a first avalanche photodiode;
second pixel circuitry including:
a second avalanche photodiode;
a first delay circuit including an input coupled to a cathode of the second avalanche photodiode;
a first circuit including a first input coupled to the cathode of the second avalanche photodiode, and a second input coupled to an output of the first delay circuit; and
a control circuit coupled to an output of the first circuit and configured to control a potential of an anode of the first avalanche photodiode based on the output of the first circuit.

(23)
The light detecting device according to (22), wherein the control circuit is configured to control a potential of an anode of the second avalanche photodiode based on the output of the first circuit.

(24)
The light detecting device according to one or more of (22) to (23), further comprising:
third pixel circuitry including:
a third avalanche photodiode;
a second delay circuit including an input coupled to a potential of a cathode of the third avalanche photodiode; and
a second circuit including a third input coupled to the cathode of the third avalanche photodiode, and a fourth input coupled to an output of the second delay circuit.

(25)
The light detecting device according to one or more of (22) to (24), wherein the control circuit includes an averaging circuit coupled to the output of the first circuit and an output of the second circuit, and configured to average the outputs of the first circuit and the second circuit to output an inter-pixel average signal.

(26)
The light detecting device according to one or more of (22) to (25), wherein the control circuit includes a time averaging circuit including an input coupled to an output of the averaging circuit and configured to output a time-averaged signal based on the inter-pixel average signal.

(27)
The light detecting device according to one or more of (22) to (26), wherein the control circuit includes a potential controller coupled to the anode of the first avalanche photodiode.

(28)
The light detecting device according to one or more of (22) to (27), wherein the potential controller is configured to control the potential of the anode of the first avalanche photodiode to be lower as the time-averaged signal rises, and wherein the potential controller is configured to control the potential of the anode of the first avalanche photodiode to be higher as the time-averaged signal lowers.

(29)
The light detecting device according to one or more of (22) to (28), wherein the control circuit includes an analog-to-digital converter configured to convert the time-averaged signal into a digital signal, and wherein the potential controller includes power electronics configured to control the potential of the anode of the first avalanche photodiode based on the digital signal.

(30)
The light detecting device according to one or more of (22) to (29), wherein the averaging circuit includes a capacitance, a first resistance coupled between the capacitance and the first delay circuit, and a second resistance coupled between the capacitance and the second delay circuit.

(31)
The light detecting device according to one or more of (22) to (30), wherein the first circuit includes a holding circuit including a switch and a capacitance.

(32)
The light detecting device according to one or more of (22) to (31), wherein the first circuit includes a first buffer circuit and a second buffer circuit, wherein the first buffer circuit is coupled between the cathode of the second avalanche photodiode and the holding circuit, and wherein the holding circuit is coupled between the first buffer circuit and the second buffer circuit.

(33)
The light detecting device according to one or more of (22) to (32), wherein the first buffer circuit is configured to buffer the potential of the cathode of the second avalanche photodiode to output a first pair of differential signals including a first positive signal and a first negative signal, wherein the holding circuit is configured to output the first positive signal according to the first delay signal, and wherein the second buffer circuit is configured to buffer the first negative signal and the first positive signal to output a second pair differential signals including a second positive signal and a second negative signal.

(34)

The light detecting device according to one or more of (22) to (33), wherein the control circuit includes an averaging circuit including:
an analog-to-digital converter (ADC) including a first input configured to receive the second positive signal, a second input configured to receive the second negative signal, and an output configured to output a digital signal based on the second positive signal and the second negative signal;
a first capacitance coupled to the first input of the ADC; and
a second capacitance coupled to the second input of the ADC.

(35)

The light detecting device according to one or more of (22) to (34), wherein the first buffer circuit includes a first current source and a first transistor coupled to the first current source, and a second current source and a second transistor coupled to the second current source.

(36)

The light detecting device according to one or more of (22) to (35), wherein the first transistor is coupled to a node configured to receive the potential of the cathode of the second avalanche photodiode, and is configured to output the first positive signal according to current from the first current source, and wherein the second transistor is coupled to a node configured to receive a ground signal, and is configured to output the first negative signal according to current from the second current source.

(37)

The light detecting device according to one or more of (22) to (36), wherein the second buffer circuit includes a third current source and a third transistor coupled to the third current source, and a fourth current source and a fourth transistor coupled to the fourth current source.

(38)

The light detecting device according to one or more of (22) to (37), wherein the third transistor is configured to receive the first positive signal and output the second positive signal according to current from the third current source, and wherein the fourth transistor is configured to receive the first negative signal and output the second negative signal according to current from the fourth current source.

(39)

A light detecting device, comprising:
first pixel circuitry including a first avalanche photodiode;
second pixel circuitry including:
a second avalanche photodiode;
a first delay circuit configured to generate a first delay signal based on a first potential of a cathode of the second avalanche photodiode; and
a first circuit configured to sample a second potential of the cathode of the second avalanche photodiode and output the sampled second potential based on the first delay signal; and a control circuit configured to control a potential of an anode of the first avalanche photodiode based on the sampled second potential output by the first circuit.

(40)

A system, comprising:
a light source; and
a light detecting device, including:
first pixel circuitry including a first avalanche photodiode;
second pixel circuitry including:
a second avalanche photodiode;
a first delay circuit including an input coupled to a cathode of the second avalanche photodiode;
a first circuit including a first input coupled to the cathode of the second avalanche photodiode, and a second input coupled to an output of the first delay circuit; and
a control circuit coupled to an output of the first circuit and configured to control a potential of an anode of the first avalanche photodiode based on the output of the first circuit.

(41)

A light detecting device, comprising:
first pixel circuitry including a first avalanche photodiode;
second pixel circuitry including:
a second avalanche photodiode;
a first delay circuit including an input coupled to an anode of the second avalanche photodiode;
a first circuit including a first input coupled to the anode of the second avalanche photodiode, and a second input coupled to an output of the first delay circuit; and
a control circuit coupled to an output of the first circuit and configured to control a potential of a cathode of the first avalanche photodiode based on the output of the first circuit.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Ranging module
110 Light emission section
120 Synchronization control section
200 Solid state image sensor
201 Pixel chip
202 Circuit chip
210 Light receiving section
211, 212 Photoelectric conversion element
220 Timing generation section
231, 232 Multiplexer
241, 242 Time-to-digital converter
250 Histogram generation section
260 Output interface
300 Circuit block
310 Monitor pixel circuit
311, 342, 344, 356, 357, 362, 363, 373, 381 pMOS transistor
320 Timing detection circuit
321, 376, 379, 382 Inverter
322 Flip-flop
330 Sample and hold circuit
331 Sample switch
332, 375, 512, 518, 519 Capacitor 340, 350 Buffer
341, 343, 352, 354, 355, 361, 372 Electric current source
370 Pulse generation circuit
371, 377 Delay circuit
351, 353, 374 nMOS transistor
378 NOT AND (NAND) gate
380 Imaging pixel circuit
400 Pixel array section
401 Monitor pixel
402 Imaging pixel
500 Control section
510 Inter-pixel average acquisition section
511 Resistor
513 Analog-to-digital conversion section
514, 517, 523, 532 ADC
515 Averaging filter
516 Selector
520 Time average acquisition section
521 Variable resistor
522 Variable capacitor
524 Digital low-pass filter
530 Electric potential control section
531 Amplifier
533 Power IC
12031 Imaging section

What is claimed is:

1. A light detecting device, comprising:
first pixel circuitry including a first avalanche photodiode;
second pixel circuitry including:
a second avalanche photodiode;
a first delay circuit including an input coupled to a cathode of the second avalanche photodiode;
a first circuit including a first input coupled to the cathode of the second avalanche photodiode, and a second input coupled to an output of the first delay circuit; and
a control circuit coupled to an output of the first circuit and configured to control a potential of an anode of the first avalanche photodiode based on the output of the first circuit.

2. The light detecting device according to claim 1, wherein the control circuit is configured to control a potential of an anode of the second avalanche photodiode based on the output of the first circuit.

3. The light detecting device according to claim 1, further comprising:
third pixel circuitry including:
a third avalanche photodiode;
a second delay circuit including an input coupled to a potential of a cathode of the third avalanche photodiode; and
a second circuit including a third input coupled to the cathode of the third avalanche photodiode, and a fourth input coupled to an output of the second delay circuit.

4. The light detecting device according to claim 3, wherein the control circuit includes an averaging circuit coupled to the output of the first circuit and an output of the second circuit, and configured to average the outputs of the first circuit and the second circuit to output an inter-pixel average signal.

5. The light detecting device according to claim 4, wherein the control circuit includes a time averaging circuit including an input coupled to an output of the averaging circuit and configured to output a time-averaged signal based on the inter-pixel average signal.

6. The light detecting device according to claim 5, wherein the control circuit includes a potential controller coupled to the anode of the first avalanche photodiode.

7. The light detecting device according to claim 6, wherein the potential controller is configured to control the potential of the anode of the first avalanche photodiode to be lower as the time-averaged signal rises, and wherein the potential controller is configured to control the potential of the anode of the first avalanche photodiode to be higher as the time-averaged signal lowers.

8. The light detecting device according to claim 6, wherein the control circuit includes an analog-to-digital converter configured to convert the time-averaged signal into a digital signal, and wherein the potential controller includes power electronics configured to control the potential of the anode of the first avalanche photodiode based on the digital signal.

9. The light detecting device according to claim 6, wherein the averaging circuit includes a capacitance, a first resistance coupled between the capacitance and the first delay circuit, and a second resistance coupled between the capacitance and the second delay circuit.

10. The light detecting device according to claim 1, wherein the first circuit includes a holding circuit including a switch and a capacitance.

11. The light detecting device according to claim 10, wherein the first circuit includes a first buffer circuit and a second buffer circuit, wherein the first buffer circuit is coupled between the cathode of the second avalanche photodiode and the holding circuit, and wherein the holding circuit is coupled between the first buffer circuit and the second buffer circuit.

12. The light detecting device according to claim 11, wherein the first buffer circuit is configured to buffer the potential of the cathode of the second avalanche photodiode to output a first pair of differential signals including a first positive signal and a first negative signal, wherein the holding circuit is configured to output the first positive signal according to a first delay signal, and wherein the second buffer circuit is configured to buffer the first negative signal and the first positive signal to output a second pair of differential signals including a second positive signal and a second negative signal.

13. The light detecting device according to claim 12, wherein the control circuit includes an averaging circuit including:
an analog-to-digital converter (ADC) including a first input configured to receive the second positive signal, a second input configured to receive the second negative signal, and an output configured to output a digital signal based on the second positive signal and the second negative signal;
a first capacitance coupled to the first input of the ADC; and
a second capacitance coupled to the second input of the ADC.

14. The light detecting device according to claim 12, wherein the first buffer circuit includes a first current source and a first transistor coupled to the first current source, and a second current source and a second transistor coupled to the second current source.

15. The light detecting device according to claim 14, wherein the first transistor is coupled to a node configured to receive the potential of the cathode of the second avalanche photodiode, and is configured to output the first positive signal according to current from the first current source, and wherein the second transistor is coupled to a node configured to receive a ground signal, and is configured to output the first negative signal according to current from the second current source.

16. The light detecting device according to claim 14, wherein the second buffer circuit includes a third current source and a third transistor coupled to the third current source, and a fourth current source and a fourth transistor coupled to the fourth current source.

17. The light detecting device according to claim 16, wherein the third transistor is configured to receive the first positive signal and output the second positive signal according to current from the third current source, and wherein the fourth transistor is configured to receive the first negative signal and output the second negative signal according to current from the fourth current source.

18. A light detecting device, comprising:
first pixel circuitry including a first avalanche photodiode;
second pixel circuitry including:
  a second avalanche photodiode;
  a first delay circuit configured to generate a first delay signal based on a first potential of a cathode of the second avalanche photodiode; and
  a first circuit configured to sample a second potential of the cathode of the second avalanche photodiode and output the sampled second potential based on the first delay signal; and
a control circuit configured to control a potential of an anode of the first avalanche photodiode based on the sampled second potential output by the first circuit.

19. A system, comprising:
a light source; and
a light detecting device, including:
  first pixel circuitry including a first avalanche photodiode;
  second pixel circuitry including:
    a second avalanche photodiode;
    a first delay circuit including an input coupled to a cathode of the second avalanche photodiode;
    a first circuit including a first input coupled to the cathode of the second avalanche photodiode, and a second input coupled to an output of the first delay circuit; and
  a control circuit coupled to an output of the first circuit and configured to control a potential of an anode of the first avalanche photodiode based on the output of the first circuit.

20. A light detecting device, comprising:
first pixel circuitry including a first avalanche photodiode;
second pixel circuitry including:
  a second avalanche photodiode;
  a first delay circuit including an input coupled to an anode of the second avalanche photodiode;
  a first circuit including a first input coupled to the anode of the second avalanche photodiode, and a second input coupled to an output of the first delay circuit; and
a control circuit coupled to an output of the first circuit and configured to control a potential of a cathode of the first avalanche photodiode based on the output of the first circuit.

* * * * *